United States Patent [19]

Shimogori et al.

[11] Patent Number: 5,135,817
[45] Date of Patent: * Aug. 4, 1992

[54] ZN-MG ALLOY VAPOR DEPOSITION PLATED METALS OF HIGH CORROSION RESISTANCE, AS WELL AS METHOD OF PRODUCING THEM

[75] Inventors: Kazutoshi Shimogori; Hiroshi Satoh, both of Kobe; Masao Toyama, Osaka; Hidetoshi Nishimoto, Miki; Koki Ikeda; Junji Kawahuku, both of Kobe; Shoji Miyake, Kakogawa; Shingo Nomura, Akashi; Hirohiko Sakai, Kakogawa, all of Japan

[73] Assignee: Kabushiki Kaisha Kobe Seiko Sho, Kobe, Japan

[*] Notice: The portion of the term of this patent subsequent to Mar. 26, 2008 has been disclaimed.

[21] Appl. No.: 601,673

[22] Filed: Oct. 23, 1990

Related U.S. Application Data

[62] Division of Ser. No. 293,419, Jan. 4, 1989, Pat. No. 5,002,837.

[51] Int. Cl.⁵ .................. B21D 39/00; B32B 15/00
[52] U.S. Cl. .................. 428/621; 428/655; 428/657; 428/658; 428/659
[58] Field of Search .............. 428/621, 623, 624, 626, 428/655, 657, 658, 659

[56] References Cited

U.S. PATENT DOCUMENTS 4,401,727  8/1983  Berke et al. .................. 428/650

Primary Examiner—R. Dean
Assistant Examiner—Robert R. Koehler
Attorney, Agent, or Firm—Oblon, Spivak, McClelland, Maier & Neustadt

[57] ABSTRACT

Zn-Mg alloy is plated by vapor deposition on the surface of metals. Since Zn and Mg are vapor-deposited as a vapor mixture of an optional ratio on the surface of metals, plated layers of excellent corrosion resistance, peeling resistance of coating film, formability, etc. can be formed. There is disclosed a method of forming uniform vapor mixtures of Zn and Mg, and vapor-depositing them on the surface of metals as the method forming the vapor-deposited layers.

5 Claims, 27 Drawing Sheets

FIGURE 12

| No. | | 1 | 2 | 3 |
|---|---|---|---|---|
| COMPOSITION OF Zn-Mg ALLOY BATH | | Zn - 71% Mg | Zn - 49% Mg | Zn - 34% Mg |
| PLATING STRUCTURE | COMPOSITION | Zn - 64% Mg | Zn - 33% Mg | Zn - 21% Mg |
| | CROSS SECTIONAL CONSTITUTION OF PLATING LAYER | ZnMg LAYER + Mg LAYER / SUBSTRATE (STEEL) (UNIFORM MONO-LAYER STRUCTURE) | ZnMg LAYER / SUBSTRATE (STEEL) (UNIFORM MONO-LAYER STRUCTURE) | $Zn_2Mg$ LAYER / SUBSTRATE (STEEL) (UNIFORM MONO-LAYER STRUCTURE) |

FIGURE 30

| No. | CONTENT OF PLATING | | CONTENT OF COATING RESIN FILM LAYER | | MAXIMUM CORROSION DEPTH (mm) 0.1 0.2 0.3 0.4 0.5 0.6 0.7 | REMARKS |
|---|---|---|---|---|---|---|
| | COMPOSITION | PLATING WEIGHT | COATING COMPOSITION | COATING WEIGHT | | |
| 1 | PURE Zn | 20 g/m² | POLYURETHANE RESIN + SiO₂ | 1.5 μm | ←PENETRATION | COMPARATIVE EXAMPLE |
| 2 | Zn-1% Mg ALLOY | " | " | " | ←PENETRATION | " |
| 3 | Zn-5% Mg ALLOY | " | " | " | | THIS INVENTION |
| 4 | Zn-9% Mg ALLOY | " | " | " | | " |
| 5 | Zn-15% Mg ALLOY | " | " | " | | " |
| 6 | Zn-28% Mg ALLOY | " | " | " | | COMPARATIVE EXAMPLE |
| 7 | Zn-10% Mg ALLOY | " | ACRYLIC RESIN + SiO₂ | " | | " |
| 8 | Zn-12% Ni ALLOY | " | POLYURETHANE RESIN + SiO₂ | " | | " |
| 9 | Zn-15% Aℓ ALLOY | " | " | " | | " |
| 10 | Zn-10% Mg ALLOY | " | POLYURETHANE RESIN + SiO₂ (SILANE COUPLING AGENT ADDED) | " | | THIS INVENTION |

ZN-MG ALLOY VAPOR DEPOSITION PLATED METALS OF HIGH CORROSION RESISTANCE, AS WELL AS METHOD OF PRODUCING THEM

This is a division of application Ser. No. 07/293,419, filed on Jan. 4, 1989 now U.S. Pat. No. 5,002,837.

BACKGROUND OF THE INVENTION

1. Field of the Invention

The present invention concerns metal materials of excellent corrosion resistance plated with a Zn-Mg alloy by vapor deposition, which are extremely useful as outer plates for vehicles or home electrical or electronic products, as well as various building materials. They include those materials that are used with or without coating, as well as include those materials used with or without fabrication such as in press molding.

Metal substrate materials to be plated in accordance with the present invention include Fe or Fe-based alloys, as well as non-iron metals such as Cu, Al and Ti or alloys thereof. They may be in any of shapes such as plates, corrugated, tubular or rod-like materials, as well as profiled materials H- or I-cross sectioned rods, with no particular restrictions. Although explanation is to be made hereinafter mainly for the most representative steel sheets, the technical scope of the present invention should not be construed only thereto.

2. Description of the Prior Art

Zn-plating has generally been employed as means for applying corrosion Resistant proof to steel sheets, etc. However, the demand for the improvement of the corrosion proofness of steel sheets, etc. has because increased, and Zn-plated steel sheets in the prior art can no more satisfy the requirement of users. It may be considered to improve the corrosion resistance by increasing the deposition amount of plating, but it brings about drawbacks such as powdering upon press molding, degradation upon spot welding and increased cost.

In view of the such a technical background, steel sheets plated with Zn-alloys such as Zn-Ni, Zn-Fe, Zn-Mn, Zn-Co, etc. utilizing the electroplating method have been developed, as well as steel sheets plated with multi-component Zn-Al alloys such as Zn-Al-Misch metal, Zn-Al-Si, Zn-Al-Mg, Zn-Al-Sn, etc. using the hot dip galvanizing method have also been developed.

However, for the Zn-alloy plated steel sheets obtained by the electroplating method, the following problems have been pointed out.

Zn-Ni plated steel plates:

Since the plating layer shows high hardness within a range of composition for providing corrosion resistance, cracks are developed to the plated layers when fabrication is applied to the plated steel sheets and red rusts are formed on the substrate steel sheets exposed through the cracks. Particularly, in the case of applying press molding, an undesired phenomenon such as powdering and flaking occurs in which the plating layers are peeled off from the substrate steel sheets and, accordingly, the corrosion resistance after the fabrication is remarkably low. In the case of pure Zn-plating, since the plating layers are too soft, the plating layers are deposited to the die upon press molding thereby causing pressing flaws upon pressing the succeeding works, as well as it deteriorates the corrosion resistance per se.

Zn-Fe plated steel sheet:

Since the plating layer contains Fe, red rusts are formed during use for a relatively short period of time. It also causes problems such as powdering or flaking upon pres molding like that Zn-Ni plating.

Zn-Mn plated steel sheet:

Since a great amount of hydrogen is evolved upon forming plating layers, current efficiency is lowered to bring about a problem with respect to productivity.

Zn-Co plated steel sheet:

Plating layers is extremely difficult in the fabrication like that of the Zn-Ni plated steel sheet and, when fabrication is applied to the plated steel sheet, cracks, are developed to the plating layer to form rusts through the crackings.

Next, in the case of steel sheets plated with Zn-Al series multi-component alloy described above obtained by the hot dip galvanizing method, since the alloying element (or elements) combined have to be compatible with molten Zn, the base metal is limited only to the Zn-Al series, as well as there are restrictions to the kind and the blending amount of other alloying elements, thereby failing to obtain improving effect of the corrosion resistance as expected. In addition, the plating layer also involves a problem that has two phases, i.e., Zn-enriched phase and Al-enriched phase are present together in admixture and the grain boundary between both of the phases is liable to be corroded. Further, in the hot dip galvanizing method, if the temperature for a plating bath is too high, there also occurs a problem that a brittle intermetallic compound layer containing Fe is formed at the boundary between the plating layer and the substrate steel sheet, thereby easily peeling off the plating layer upon fabrication. In addition, for the conventional Zn series plating, there has been noted a common defect that the corrosion resistance after the coating is not always satisfactory.

As has been described above, conventional Zn series plated steel sheets involve problems in the corrosion resistance, fabricability, productivity, etc. and development has been sought for Zn series plated steel sheets capable of satisfying these requirements altogether.

In view of the situations as described above, various studies have been made for the chemical treatment in the Zn-series plating. The most fundamental method for the chemical treatment, there can be mentioned a chromate treatment. However, film layers formed by the conventional chromate treatment are extremely thin. Accordingly, Zn-series plating layers on the substrate are liable to be exposed due to the flaws formed in the chromate film layers or the defoliation of such layers, etc. and, accordingly, the corrosion resistance of the Zn-series plated steel sheets applied with chromate treatment is not satisfactory.

Antirust sheets usually referred to as zinchrometal used as outer plates for vehicles comprise a first layer containing a chromium compound formed on a steel sheet and a second layer comprising zinc powder and resin prepared by coating zinc-enriched paints. In this case, improvement of corrosion resistance is intended by suppressing the corrosion of the substrate steel sheet by the sacrificial protective effect of Zn powder in the zinc-enriched paint layer of the second layer and, thus, electro-depositing coating and spot welding are enabled by utilizing the electroconductivity. However, for attaining sufficient corrosion resistance electrodeposition coatability and spot weldability in the steel sheets described above, it is necessary to increase the content of the zinc powder in the zinc-enriched paint to more than 80%. However, if the Zn content is so increased, it brings about a problem wherein the zinc-enriched paint layer is peeled off in a powdery form (flaking phenomenon) upon applying press molding, etc. to deteriorate the fabricability. Accordingly, in order to maintain a sufficient fabricability, the content of the Zn powder may be decreased. However, if the content of the Zn powder is decreased, it causes the reduction in the corrosion resistance, as well as reduction in the electrodeposition coatability and the spot weldability due to the lowering in the electroconductivity.

Further, Japanese Patent Laid-Open Nos. Sho 58-98172 and 57-108292 disclose composite coated steel sheets in which a chromate film layer is formed on a Zn series and/or Al series plating layer and a composite organic silicate film is formed further thereover. Although anti-rust steel sheets disclosed in these laid-open publications can satisfy the fabricability, as well as show excellent properties in view of corrosion resistance, adherance and corrosion resistance of paints, etc., there are still left problems in view of the corrosion resistance in close examination and, further, there has been an increasing demand for antirust steel sheets having more excellent corrosion resistance.

Zn-Mg alloy plating has been developed in view of the foregoing demand, which has been produced so far by means of a hot dip galvanizing method. Zn-Mg alloy plating by hot dip galvanizing method can provide some effect for the corrosion resistance, but it involves the following problems. That is, a top-dross is formed much on much of the surface of molten Zn-Mg bath. This is the reason why molten Mg is oxidated easily in the air. The formation of the top-dross causes the poor appearance of the plated steel sheet and the reduction of the amount of molten Zn-Mg alloy which can use for plating. They are very disadvantageous in view of the manufacturing of hot dip galvanized steel sheets.

The hot dip galvanizing method shows a further problem as described below. That is, since the melting point of Mg (651° C.) is much higher as compared with that of Zn (419° C.), there is a limit for the amount of Mg that can be added to molten Zn in the case of the hot dip galvanizing, and it is impossible to optionally control the plating composition of Zn-Mg alloys. Accordingly, since Mg can not be added by a desired amount, Mg addition effect can not always be obtained sufficiently. In addition, since the hot dip galvanizing process is conducted under high temperature condition, oxide layers or intermetallic compound layers are formed between the plating layer and the steel sheet to obtain only those plating products lacking in good adhesion and fabricability. Further, there is also a problems that the plated substrate such as steel sheets are denatured by the effect of heat treatment (formation of heat treated texture).

Furthermore, if it is intended to employ an electroplating method using usual aqueous solution, since the oxidation—reduction potential of Mg is less noble in comparison with that of hydrogen, electrodeposition of Mg is impossible.

BRIEF SUMMARY OF THE INVENTION

Object of the Invention

As has been described above conventional Zn plating involves various drawbacks. In view of the above, the present inventors have made a study on novel Zn plating with no such drawbacks.

Specifically, an object of the present invention is to provide Zn-Mg plated metals capable of providing excellent corrosion resistance when used with or without applying a coating.

Another object of the present invention is to provide Zn-Mg plated metals showing satisfactory adhesion for the coating of the plated surface and causing no peeling of coating films when used in the coated state.

A further object of the present invention is to provide Zn-Mg plated metals capable of resisting flaking or peeling of plating, when plated metals are fabricated, by showing good adhesion of the plating to the substrate metals and forming plating layers of satisfactory fabricability.

A steel further object of the present invention is to provide Zn-Mg plated metals with optionally controlled Zn and Mg composition ratios and further containing other ingredients other than Zn and Mg.

The foregoing and other objects will become more apparent by reading the following descriptions.

BRIEF DESCRIPTION OF THE DRAWINGS

FIG. 12 is a view illustrating a relationship between a Zn-Mg alloy bath composition and a vapor-deposited layer structure.

FIG. 30 shows a relationship between various plated steel sheets and maximum corrosion depth after the cyclic corrosion test.

DETAILED DESCRIPTION OF THE PREFERRED EMBODIMENTS

Figure 1A:
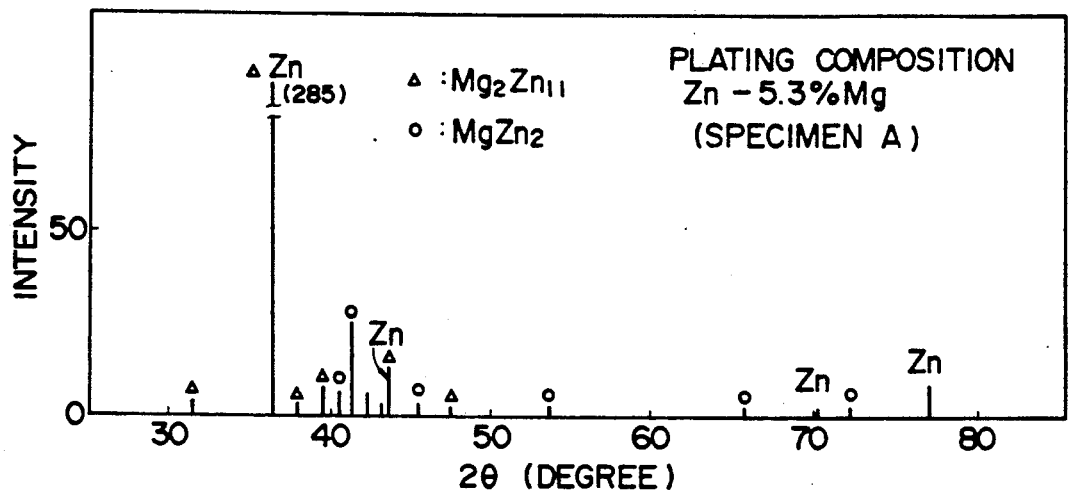
FIGS. 1(a)–(f) show the X-ray diffraction pattern for Zn-Mg alloy plating layers of various compositions.
Figure 1B:
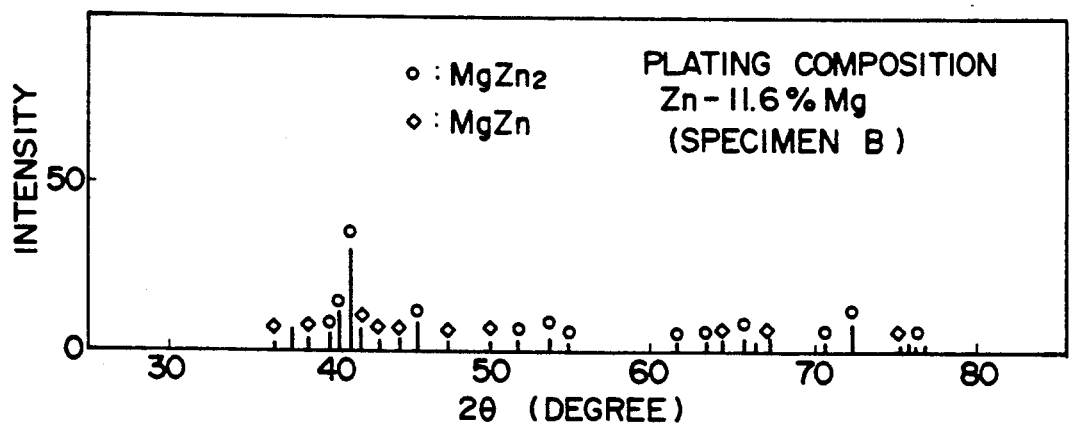
Figure 1C:
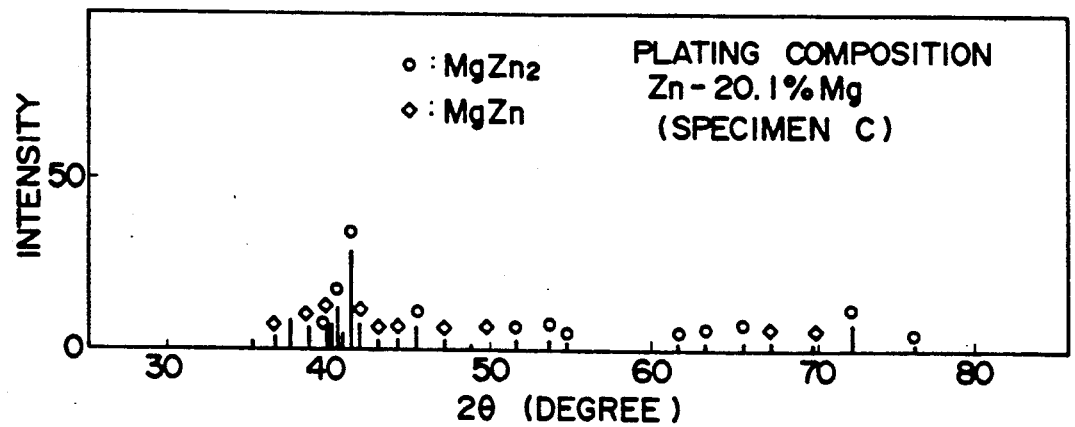
Figure 1D:
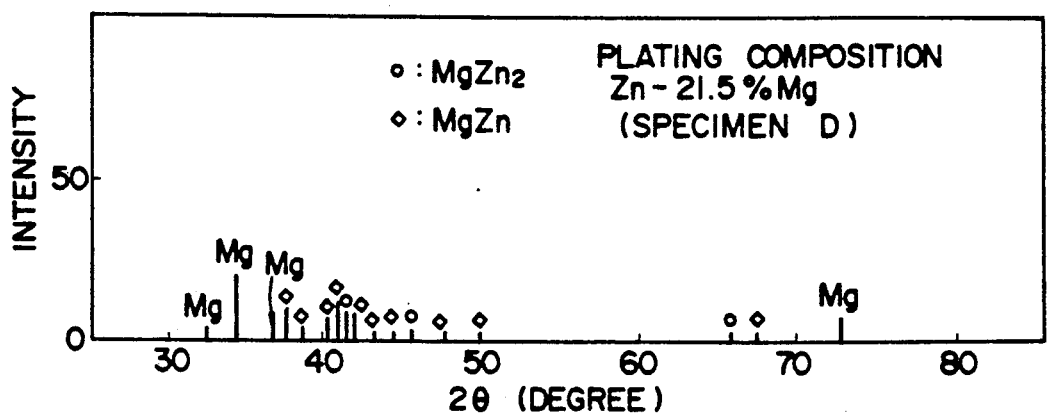
Figure 1E:
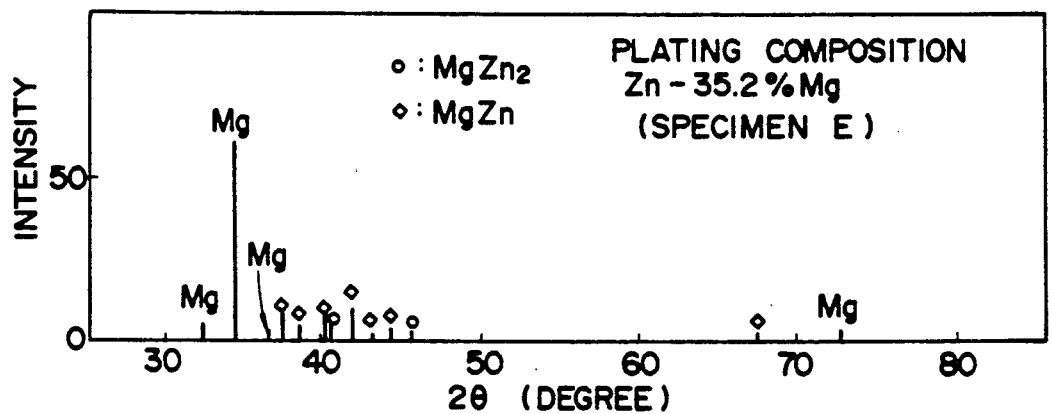
Figure 1F:
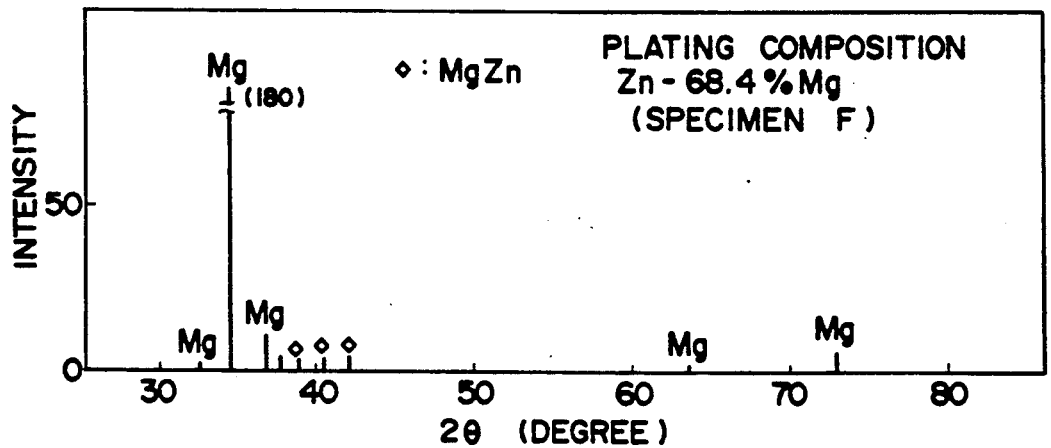

Most basic constitution of plated metals provided by the present invention are to be described next. They are obtained by vapor-depositing using the mixed vapor of Zn and Mg on a substrate metal such as Fe, Al, Cu and their alloy. The compounding composition, in the case of Zn-Mg binary alloy, comprises from 0.5 to 40% by weight (hereinafter simply referred to as %) of Mg and the substantial balance of Zn.

It is possible to optionally adjust vaporizing amount of Zn and Mg, and consequently the composition and the plating weight of Zn-Mg alloy plating by means of controlling the temperature of Zn bath and Mg bath, vaporizing Zn and Mg respectively, and depositing Zn vapor and Mg vapor on substrate. As vapor deposition is usually performed under vacuum for preventing vapor-deposition metals from oxidation, the present invention is conducted under such vacuum condition of lower than about $10^{-2}$ Torr. Any optional means can be employed for heating Zn and Mg. Since Zn has a low melting point (419° C.) and a high vapor pressure, the usual electric resistance heating can be used as the heating method of Zn. On the other hand, Mg has also a low melting point (651° C.) but lower vapor pressure than Zn. As the heating source of Mg, high energy beams such as highly heat converging electron beams of high frequency and also electric resistance heating can be employed. In any case, the ratio for the vaporizing amount between Zn and Mg can optionally be adjusted by controlling the heating temperatures for Zn and Mg respectively, by which the content ratio of Zn/Mg constituting the vapor deposited layer can optionally be varied. In addition, since the vapor deposition method is conducted under the high vacuum condition as described above, there is never any possibility that oxide layers are formed on the surface of steel sheets so that the plating layer would have the poor adhesion. In addition, since there is no long time exposure under high temperature circumstance as in the hot dip plating method, there is no possibility that brittle intermetallic compound layers, are formed at the boundary with the steel sheets to deteriorate the interlayer bonding strength.

The pre-heating temperature condition for the substrate steel sheet before plating is extremely important for getting the good adhesion of the plating layers, as well as preventing the formation of brittle intermetallic compound layer between Zn-Mg alloy layer and the surface of steel sheets. If the pre-heating temperature is lower than 150° C., the adherance of the plating layer of Zn-Mg alloy is poor and the plating layer is easily exfoliated tending to reduce the corrosion proofing effect. On the other hand, if the pre-heating temperature exceeds 300° C., Zn deposited to the surface of the steel sheet causes reactions with the steel sheet to form a Zn-Fe intermetallic compound phase between the plating layer and the surface of steel sheets which deteriorates the mechanical properties.

The method of vapor deposition plating is not specific but there can be employed, for example, a method of heating to vaporize Zn and Mg respectively from individual baths in crucibles in a vacuum chamber and continuously applying vapor deposition plating by running a steel strip pre-heated to some temperature above said crucibles, a method of conducting the aforementioned operation batchwise, etc. In addition, an ion-plating method of ionizing metal vapors and depositing them to the surface of a substrate can also be applied as one of the vapor deposition methods employed in the present invention. Since the Zn-Mg alloy plating layer obtained by the ion-plating method can make the crystal grains finer to form a dense plating layer with less pin holes, the effect for improving the corrosion resistance is more remarkable. The vapor deposition method recommended as the most preferable means by the present inventors will be described specifically later.

Referring then to the composition of the Zn-Mg alloy constituting the plating layer, in order to attain the object of the present invention, the composition should comprise from 0.5 to 40% of Mg and the substantial balance of Zn. The Mg content is preferably 3-30% and, more preferably, 5-25%. If the content of Mg is less than 0.5%, no substantial effect of adding Mg can be obtained, and there can be recognized no substantial difference from a plating layer using pure Zn, particularly, with respect to corrosion resistance. On the other hand, if the content of Mg exceeds 40%, corrosion resistance after coating to the surface of the Zn-Mg alloy plating layer is deteriorated. The reason may be considered as given below. If a Zn-Mg plating layer is injured or cracked by some or other external effect the injured or cracked portion becomes an anode while the portion below the coating film becomes a cathode. The dissolution of plated metal proceeds through the reaction: $4M \rightarrow 4M + 4e-$ at the anode, while pH value below the coating film layer is increased due to the reaction: $2H_2O + 4e \rightarrow 4OH-$ at the cathode. Thus, if the alkali resistance is too high, a blister of the coating is caused by cathode reaction below the coating film layer and the corrosion resistance of Zn-Mg vapor-deposited steel sheet after coating is remarkably worsened.

This will become more apparent by the explanation made later regarding the structure of the plating layer.

Moreover, a Zn-Mg alloy plating layer containing Mg from 0.5 to 40% which shows an outstandingly excellent corrosion resistance as compared with a plating layer only consisting of Zn, has a sacrificial protective effect which is in common with Zn-series platings, as well as an advantageous property of extremely excellent adhesion to steel sheets, etc. Thus, the corrosion resistance of the plated steel sheets can be improved greatly and the excellent formability can also be achieved. Although the thickness of the plating layer has no particular restrictions, the purpose of corrosion protection can be attained generally by defining the coating weight to greater than about 3 g/m$^2$ thereby ensuring the thickness of greater than 0.5 μm.

Recently, demands for Al or Al alloy plates have rapidly increased mainly for the purpose of reducing total weight in the field of vehicles and building materials, but these Al or Al alloy plates involves drawbacks since it is difficult to form phosphate layers applied by chemical treatment intended for the improvement of corrosion resistance or the improvement of the adhesion with painting layers. In addition, the phosphates including Al$^{3+}$ are dissolved in phosphate treatment solution to remarkably shorten the working life of this solution. On the other hand, when applying Zn-Mg alloy plating by vapor deposition to such Al or Al alloy plates in the above method, such troubles can be prevented.

Accordingly, the Zn-Mg alloy layers obtained by the vapor deposition method under vacuum have excellent corrosion resistance as described above. In addition, it can also be found an extremely excellent practical effect can be obtained in that blister of the coating films when they are used after applying coating is rarely observed. Thus, the structure of the Zn-Mg alloy plating layer has been studied specifically with an aim of recognizing the technical reason why that the blister resistance of the coating film on the Zn-Mg alloy plating is particularly excellent. In this study, it has been found that although the Zn-Mg alloy vapor deposited layer contains Mg as the alloying metal for the plating layer, the blister resistance of the coating film is satisfactory in a case where all of Mg form intermetallic compounds with Zn (that is, it is not present as a phase consisting only of Mg).

The effect of the present invention is to be described next while explaining the progress of the experiment leading to the above-mentioned fact.

At first, the present inventors prepared zinc-alloy plated steel sheets having various compositions by means of vapor deposition in vacuum. Then, X-ray diffraction technique was conducted for each of the obtained specimens (Cu-Kα, 45 KV, 160 mA) to analyze the phase structure.

The results are shown for each of the specimens in FIGS. 1(a)-(f). Taking notice, particularly, of the Mg phase, the Mg phase appears when the Mg content in the plating layer exceeds about 20%, a trend is seen that the X-ray diffraction intensity of Mg is increased with the increase in the Mg content. However it has also been confirmed that the Mg phase may be present or not depending on the difference of the plating conditions, even with respect to Zn-Mg alloy plating layers with the same extent of Mg content (for example, refer to FIGS. 1(c) and (d)).

Figure 2:
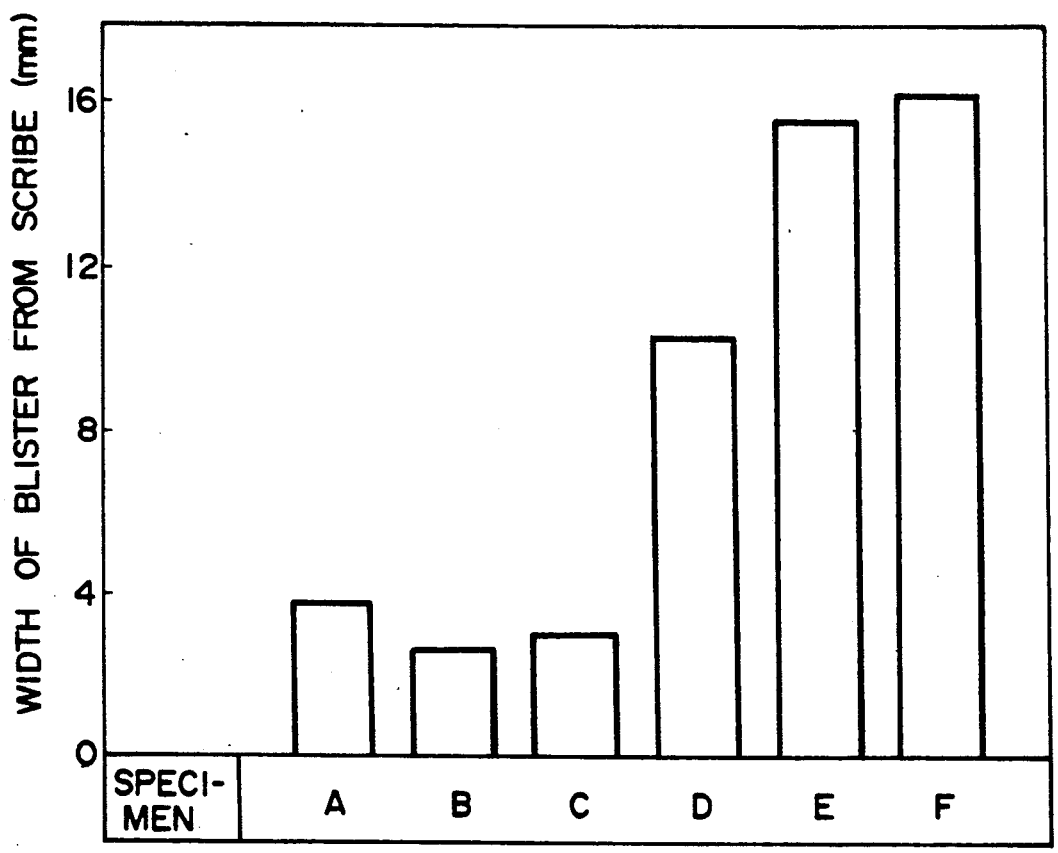
FIG. 2 shows the width of blister of coating film from scribe in coated various Zn-Mg alloy plated steel sheets.

Then, after coating each of the specimens (coating film thickness of about 90 μm), salt spray test was conducted for 500 hours, and the blister width of the coating film from the end face of each of the specimens was measured. The results are shown in FIG. 2. In FIG. 2, the respective specimens are described as A-F corresponding to the appendixes in FIG. 1.

From the results of FIGS. 1 and 2, it can be considered as described below. Blister of coating films was remarkably large for the specimens D-F (refer to FIG. 1(d)-(f)) in which the Mg phase (consisting only of Mg) is present in the plating layer, whereas less blister of the coating film was observed for the specimens A-C (refer to FIG. 1(a)-(c)) in which the plating layer was constituted with Zn phase or Zn-Mg intermetallic compound phase. Particularly, as apparent from the comparison between the specimens C and D, there was recognized a remarkable difference for the blister width of the coating layer, although the content of Mg in the plating layer was almost the same. Accordingly, it has been found that the structure of the plating layer greatly contributes to the blister resistance of the coating films in the Zn-Mg alloy plating materials and, particularly, the absence or presence of the phase consisting only of Mg gives a significant effect of blister resistance of the coating films. Furthermore, it was most effective that the phase consisting only of Mg was not present near the surface of the plating layer.

In the Zn-Mg alloy plating by vapor deposition according to the present invention, the upper limit of the Mg content is defined as 40% as described above. However, as apparent from the previous explanation referring to FIGS. 1 and 2, it is considered that a lower value (for example, 20%) is preferred for the upper limit of the Mg content as far as the blister resistance of coating films is concerned. Further, the Zn-Mg alloy plating is necessary to satisfy the formability, which caused the technical problems in the prior art (for example, prevention for the degradation of the corrosion resistance after press molding). In view of the above, the relationship of the Zn-Mg intermetallic compound with the chemical composition has been considered and further studied.

At first, the present inventors have made a study on the reason why the Zn-Mg alloy vapor deposited materials shows excellent corrosion resistance. According to the study, it has been found that if the Zn-Mg alloy vapor deposited steel sheet is exposed in which a corrosive atmosphere where chlorine ions are present, Mg in the plating layer reacts with the chlorine ions and, dissolved to a certain extent to form a special corrosion product layer, at the surface of the plating layer, comprising Mg and ZnCl$_2$.4Zn(OH)$_2$ in which hexagonal system crystals of ZnCl$_2$.4Zn(OH)$_2$ are arranged in order on the surface of the plating layer and this corrosion product layer can provide excellent corrosion resistance. Accordingly, in a circumstance where a lot of NaCl is contained in surrounding air, for example, near the sea shore, the effects of NaCl on Zn-Mg alloy layer are remarkable. That is, a layer comprising Mg and ZnCl$_2$.4Zn(OH)$_2$, in which hexagonal system crystals of ZnCl$_2$.4Zn(OH)$_2$ are arranged densely on the surface of Zn-Mg alloy plating, is covered with the surface of the Zn-Mg alloy vapor deposited layer under the effect of NaCl. It has further been found that the presence of Mg in the plating layer suppresses the progress of Zn→ZrO (one of corrosion products) for the reason of the improvement in the corrosion resistance of the Zn-Mg alloy plating under usual corrosive circumstance. Since the formation of ZnO is increased with the increase in weight loss of the plating layer by corrosion, suppression of the formation of ZnO means the improvement for the corrosion resistance. Further, since hexagonal system crystals of $ZnCl_2 \cdot 4Zn(OH)_2$ are arranged densely on the surface of the plating layer in order, it has also been found that they can provide an effect of preventing the diffusion of oxygen into plating layer and consequently the formation ZnO in the deep portion of the plating layer. Thus, it can be said that Zn-Mg alloy plated material having such a feature is extremely suitable to the purpose for providing the corrosion resistance.

Then, the present inventors have closely studied the reason why the Zn-Mg alloy vapor deposited steel sheets show excellent formability. As a result, it has been found out that the formability is greatly dependent on the phase structure of the Zn-Mg alloy plating layer. Namely, when the phase structures of the Zn-Mg alloy plating layer were investigated by X-ray diffraction technique, it has been found that Zn-Mg plating layers of excellent formability have such a structure mainly comprising one or more of compounds selected from $Mg_2Zn_{11}$, $MgZn_2$, $MgZn$, which are intermetallic compounds of Zn and Mg, or further comprising, in addition thereto, a little amount of Zn ($\eta$phase) as described in FIG. 1. A structure mainly comprising $MgZn_2$ is particularly excellent in its formability, among those materials. On the other hand, in the Zn-Mg alloy plating layers of poor formability, a structure comprising almost all Zn ($\eta$phase), a phase consisting only of Mg or containing other intermetallic compounds than above (for example, $Mg_7Zn_3$) was formed.

It has not yet been clear at present why only the plating layers of a phase structure mainly comprising one or more of $Mg_2Zn_{11}$, $MgZn_2$, $MgZn$ (or further containing a little amount of Zn) exhibit satisfactory formability, but it may be considered to be attributable to the hardness of the plating layer consisting of such intermetallic compounds which is closer to the hardness of the substrate steel sheet or mold die. That is, it is considered that since the plating layer is deformable with the substrate steel sheet when being formed, there is no possibility for the occurrence of the powdering phenomenon as described above and that since the plating layer has a hardness to some extent, it is less likely to deposit an the mold die. However, as the Zn content is increased (that is, Mg content is decreased), soft Zn ($\eta$phase) becomes predominant. On the other hand, if the Mg content is increased, soft phase only consisting of Mg or undesired intermetallic compound ($Mg_7Zn_3$) is formed.

Figure 3:
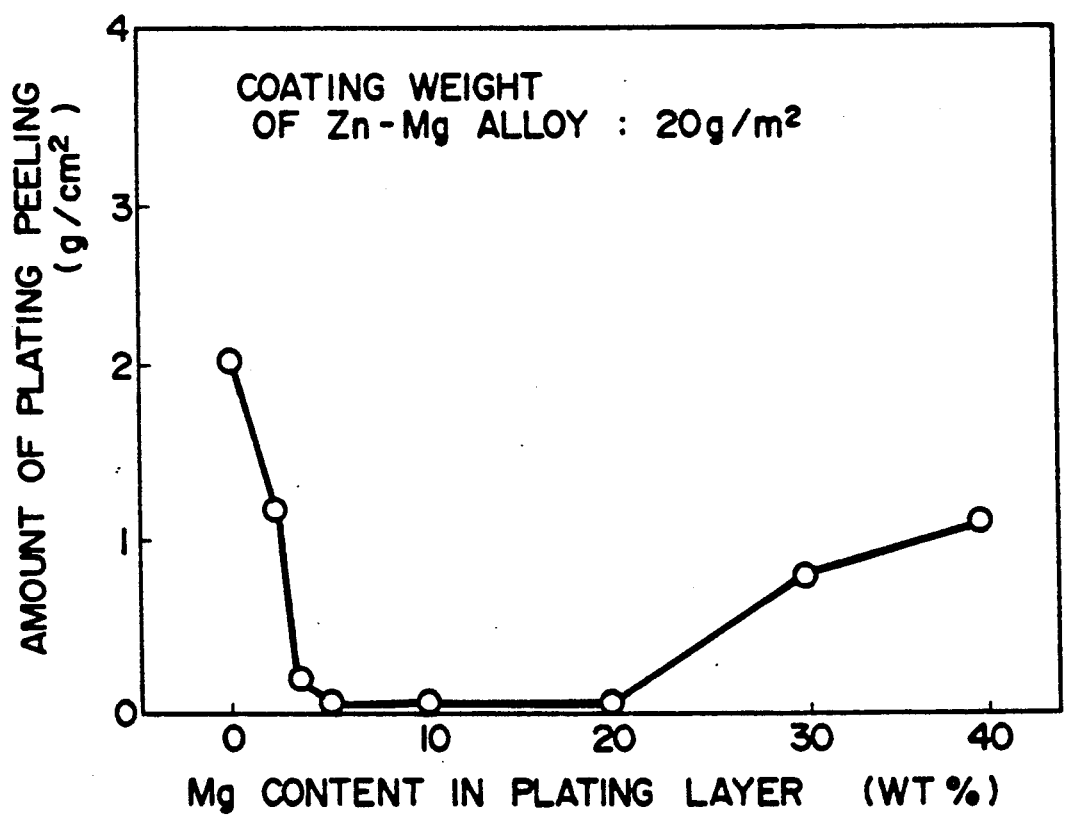
FIG. 3 shows a relationship between the Mg content in Zn-Mg alloy vapor-deposited steel sheet and the amount of peeling of plating by the Draw-bead test.

After all, for providing both of the formability and corrosion resistance, that is, for obtaining a plating layer within a range of Mg content that shows excellent corrosion resistance (from 0.5 to 40% by weight) and, particularly, provides excellent formability (plating exfoliation of less than about 1 g/cm$^2$), Mg content is preferably about from 3 to 30% (refer to the result of Draw bead test in FIG. 3). In view of the prevention for the blister of coating layers, Mg content within a range of less than 20% is preferred. However, since the Mg phase may or may not be present depending on the difference of the plating conditions even for Zn-Mg alloy layers containing nearly the same content of Mg, the Mg content can not be defined simply. For instance, if the temperature of the substrate before plating is low or the distance between Zn bath and Mg bath is large, alloying becomes insufficient thereby causing various conditions such as presence or absence of the phase only consisting of Mg or Zn. Thus, even if the Mg content of Zn-Mg alloy plating is similar, the composition of Zn-Mg alloy layer is different depending on the difference of the condition for the vapor deposition plating.

Subsequently explanation is to be made for the improved constitution of the Zn-Mg alloy vapor deposition plating described above.

It has been found that when vapor deposition plating is conducted for three, four or more elements by adding one or more of elements selected from the group consisting of Cr, Co, Mn, Ti, Ni and Al onto Zn-Mg alloy, they show corrosion resistance and fabricability superior to comparable with those of Zn-Mg binary alloy vapor deposition plating. Since the present invention is fundamentally based on the employment of the vapor deposition method, even if the third metal element is used in addition to Zn or Mg, it is possible to easily obtain multi-component alloy vapor deposition plating of a desired composition by controlling the heating temperature for each metal bath heated independently.

The Mg content in such multi-component alloy, for example Zn-Mg-4 alloy, is from 0.5 to 40% like that in the case of the Zn-Mg binary alloy. However, since it is necessary to obtain an effective function of the third element and make full use of the sacrificial corrosion protection of Zn in ternary, quaternary or multi alloy vapor deposition plating, it is recommended that the Mg content is less than 30%. On the other hand, the effect of Mg can be obtained efficiently by defining the lower limit of Mg to preferably 3%, more preferably 5%.

Referring to the addition amount of the alloying metals such as Cr, Co, Ti, Mn, Ni and Al, it is necessary to define it from 0.5 to 5% in total of all of them. If the addition amount of such element is less than 0.5 no substantial improvement can be obtained for the corrosion resistance. On the other hand, if it exceeds 5%, the sacrificial corrosion protection of the Zn-Mg alloy plating layer is reduced.

Next, explanation is made for the development to the double-layered plating structure.

In the single Zn-Mg alloy vapor deposited layer, the corrosion resistance after coating tends to be reduced along with the increase in the Mg content of Zn-Mg alloy. That is, if the coating film should be injured after the coating, blistering of the coating layer, is liable to be caused around the periphery of the injured portion thereby bringing about a problem in the corrosion resistance after coating.

The mode of coating film degradation due to the corrosion below the coating film is different in the cathode portion and the anode portion in a local cell. Since OH- is produced by cathode reaction under the neutral condition and where the dissolved oxygen is present, the condition below the coating layer becomes alkaline and, accordingly, the coating layers are softened to reduce the adhesion to the substrate. In addition, when most of coating layers are in contact with an aqueous solution, the solid phases are charged negatively and the liquid phases are charged positively to form interfacial electric double layer. Then, since moistures is introduced to the cathode portion due to the electroosmotic effect by corrosive current, large alkaline blisters (peeling of coating layers) tend to be formed combined with the effect of alkali. Furthermore, near the anode portion, the blisters are small but easy to be broken due to the acidic condition and occurrence of rusts. For instance, it is known that if the coating layers are scratched such as scribe and exposed to the corrosive circumstance, the injured portion becomes the anode portion (acidic), while the area below the coating layer becomes the cathode portion (alkaline), to show highly alkaline at pH 10–12 due to the reaction: ½ $O_2 + H_2O + 2e^- \rightarrow 2OH^-$.

Since Mg lacks in alkali resistance as described above, the corrosion resistance of Zn-Mg alloy plating after coating is decreased along with the increase in the Mg content of Zn-Mg alloy vapor deposition plating. In other words, if the plating layer has good alkali resistance, the foregoing disadvantages in the cathode portion can be suppressed to improve the corrosion resistance and blister resistance of coating layers after coating.

In view of the above, it has been found that, with the purpose of further improving the corrosion resistance after the coating for the Zn-Mg alloy vapor deposited layer, when the Zn-Mg alloy plating layer is further coated with a Zn-Ti alloy plating layer, the corrosion resistance and the blister resistance after coating can further be improved.

Figure 4:
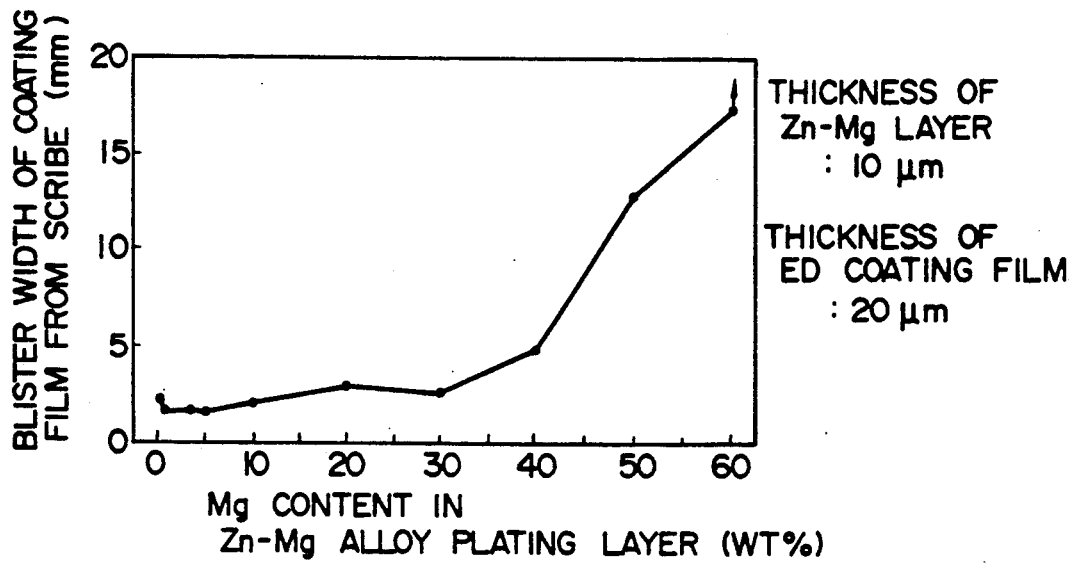
FIG. 4 shows a relationship between Mg content in Zn-Mg alloy plating layer and the width of blister of coating film from scribe.

By the way, although the corrosion resistance after coating can be improved in a case where the Zn-Mg alloy vapor deposition plating is applied to the substrate metal as shown in FIG. 4, the corrosion resistance after coating is reduced if the Mg content is excessively increased. In this regard, FIG. 4 shows a relationship between the Mg content (%, including 0%) in the Zn-Mg alloy layer and the blister width of the coating layer from scribe in a case where Zn-Mg alloy vapor deposited layer is applied to a thickness of 10 μm on a cold rolled steel sheet of 0.6 mm thickness, which is further applied with electrodeposition coating (ED) to a thickness of 20 μm, applied with cross cuts and subjected to salt spray test (SST) for 1000 hours.

Figure 5:
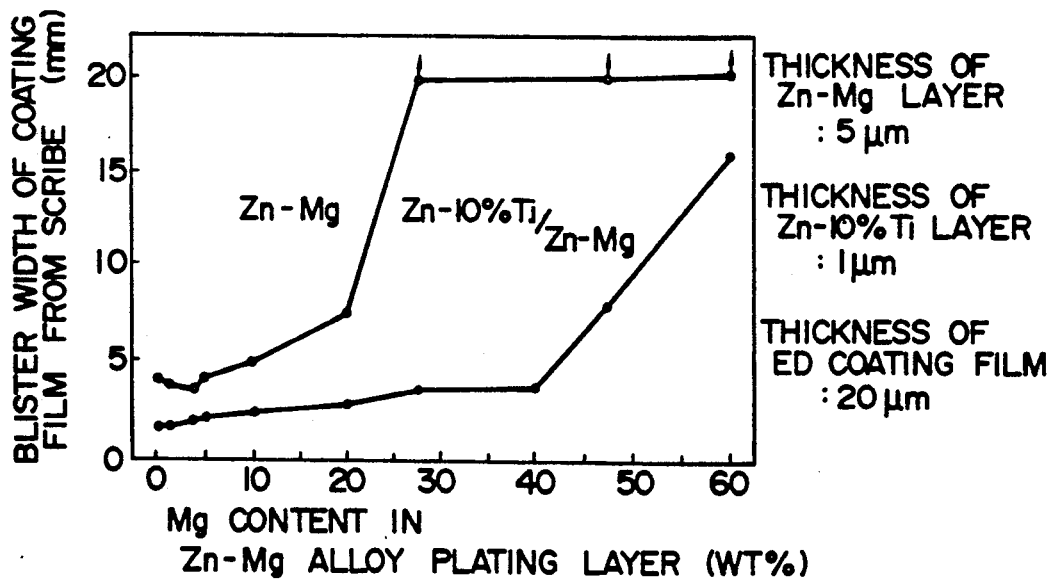
FIG. 5 shows a relationship between Mg content in the Zn-Mg alloy layer and Zn-Ti/Zn-Mg alloy plated double layer and the width of blister of coating film from scribe.

Then, it has been found that if a Zn-Ti alloy plating layer of additional excellent alkali resistance is coated to the Zn or Zn-Mg alloy plating layer, remarkable improvement can be obtained as shown in FIG. 5.

That is, after cleaning the cold rolled steel sheet of 0.6 mm thickness by electrolytic degreasing, Zn-Mg alloy vapor deposited steel sheets of various compositions were prepared at a pressure of $1 \times 10^{-2}$ Torr and at a pre-heating temperature of 200° C. Then, Zn-10%Ti alloy plating layer was further prepared by vacuum vapor deposition under the same conditions to some of Zn-Mg alloy plating layers to form double-layered alloy plated steel sheets comprising Zn-10%Ti/Zn-Mg. These Zn-alloy series plated steel sheets were treated with phosphates, then applied with electrodeposition coating to a thickness of 20 μm, applied with cross cuts and subjected to a cyclic corrosion test. The thickness of the Zn-Mg layer was 5 μm and the thickness of the upper Zn-10%Ti layer was 1 μm.

The results of the cyclic corrosion test are shown after conducting for 1000 hours the following (1), (2), (3) as one cycle.

(1) dipping (50° C., 5%NaCl aqueous solution, one hour) (2) wetting (50° C., salt spray, 2 hours) (3) drying (50° C., 1 hour)

As apparent from FIG. 5, it can be seen that the blister resistance of coating films for the double-layered Zn-Ti alloy/Zn-Mg alloy vapor deposited steel sheets than the Zn-Mg alloy vapor deposited ones can be improved greatly. Further, it is found that the suitable Mg content in the Zn-Mg alloy plating layer is less than 40% in view of the results seen in FIG. 5. It has also been confirmed that the excellent corrosion resistance below the coating layers can be obtained also even if pure Zn vapor deposited layer with 0% of Mg content is prepared, by applying Zn-Ti alloy vapor deposited layer on Zn plating layer.

On the other hand, it has been found that the Ti content in the Zn-Ti alloy layer constituting the upper layer is preferably less than 20 %, because the effect of addition is saturated at 20 %.

Although, there is no particular restriction for the thickness of the Zn-Ti alloy plating layer, if the thickness is less than 0.1 μm, coverage of the under Zn-Mg alloy plating layer is insufficient failing to obtain substantial effect because of plating pin holes, etc. of Zn-Ti alloy layer. On the other hand, if the thickness of the Zn-Ti alloy plating layer exceeds 0.1 μm, the under Zn-Mg alloy layer can be covered completely with Zn-Ti alloy layer to improve the alkaline resistance of the Zn-Mg alloy. However, if the thickness exceeds 2 μm, no such effect can be raised, only leading to economical disadvantage.

Although explanation has been made to the double-layered plating structure in a case where Zn-Ti alloy layer is formed as the upper one, similar effect can also be observed in a case where the plating layer prepared as the upper layer comprises pure Zn layer or alloy layer of Zn and one or more of metals selected from Ni, Co, Mn, Fe, Cr, Mo and Cu. The content of Ni, Co, Mn, Fe, Cr, Mo and Cu in these Zn-alloy layer is, preferably, less than 20% like that the case of Ti. It should be considered that there is n substantial lower limit for content as can be understood from the fact that excellent corrosion resistance after coating can be obtained also in the pure Zn layer as the upper layer. However, so long as they are purposely added to form an Zn-alloy plating layer, the effect of the addition has to be obtained effectively and, from such a view point, content of greater than 0.5% is desired.

In the following explanation will be made for the case of forming a resin film on the Zn-Mg alloy vapor deposited layer instead of the composite layer plating.

As described above, Zn-Mg alloy vapor deposition plating without coating shows excellent corrosion resistance in the atmospheric air but the corrosion resistance of Zn-Mg alloy layer after coating is by no means sufficient in case of high content of Mg in Zn-Mg alloy vapor-deposited layer. This problem can be solved by the formation of layers mainly comprising polyurethane resin and silicon dioxide to be described here. The technical effect is to be explained referring to the progress of the investigation.

The present inventors have applied chromate treatment to Zn and various kind of Zn alloy plated steel sheets as the substrate and formed, further thereover, layers mainly composed of polyurethane resin and silicon dioxide (hereinafter sometimes simply referred to as polyurethane layer) capable of obtaining satisfactory electrodeposition coatability and adhesion of painting film as described below. Then, after conducting 200 cycles of cyclic corrosion tests as shown below, rusts were removed by brushing in an aqueous ammonium citrate solution, and measured the maximum corrosion depth in the substrate steel sheet by using a dial gauge. The results are shown in FIG. 6.

Cyclic corrosion test (1 cycle/8 hr)

Salt spray (SST) 5% NaCl aqueous solution, 35° C.×4 hr) →drying (60° C.×2 hr)→wetting 50° C.×2 hr, 95% RH)

Figure 6:
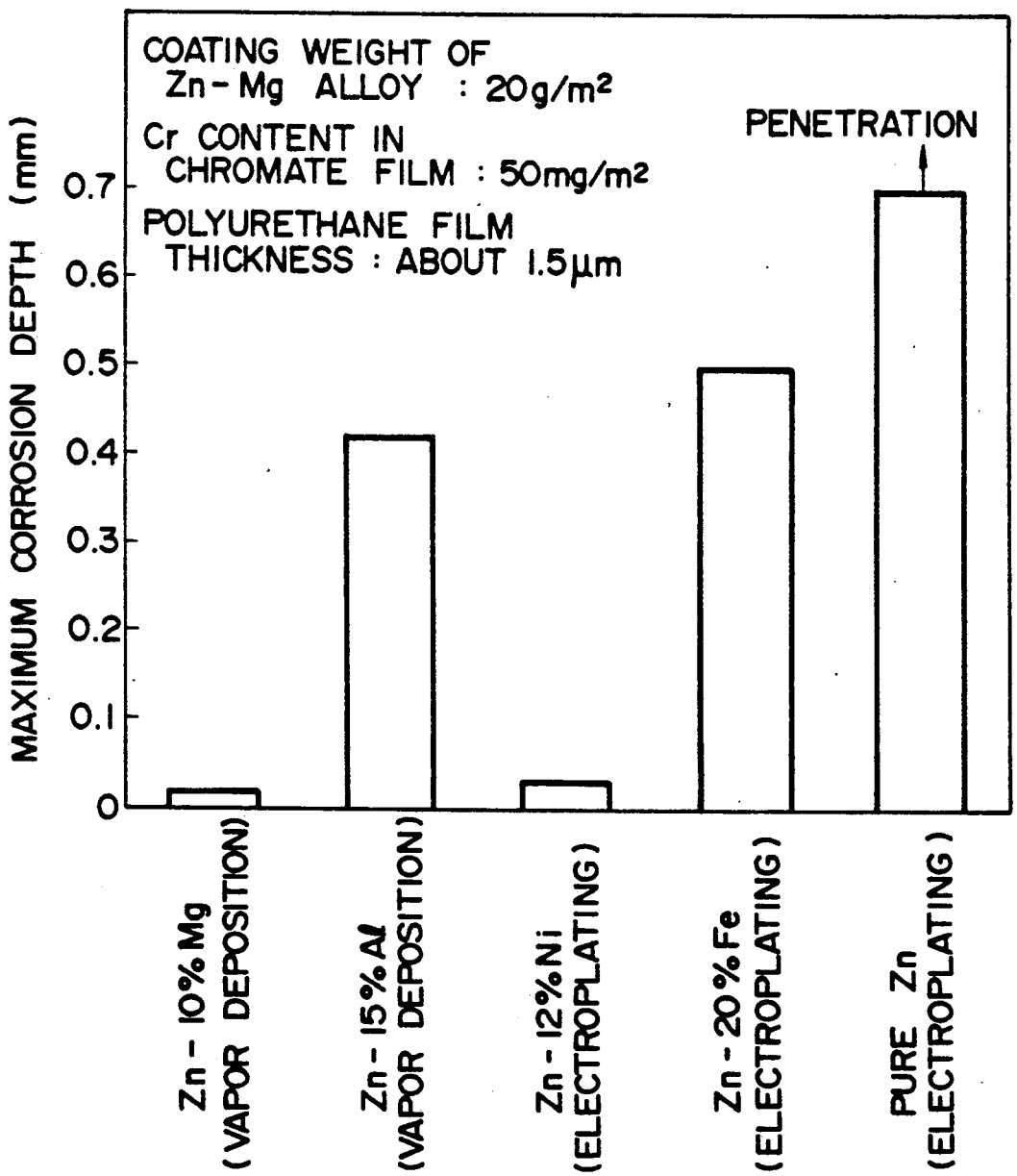
FIG. 6 shows a relationship between various Zn placed steel sheets and the maximum corrosion depth in the cyclic corrosion test.

As apparent from FIG. 6, it has been found that Zn-10%Mg alloy vapor deposited steel sheets and Zn- 12%Ni electroplated steel sheets show the least for the maximum corrosion depth and excellent corrosion resistance among various kinds of Zn-plated steel plates. However, since Zn-Ni electroplated steel sheets are poor in the formability as described above, they are extruded in the present invention. Accordingly, it has been found that the Zn-Mg alloy vapor deposition plating is most suitable for obtaining the effect of polyurethane layers described in the present invention.

Then, for investigating the relationship between the Mg content in the Zn-Mg alloy plating and the corrosion resistance, various kinds of Zn-Mg alloy plated steel sheets with different Mg contents were prepared; layers mainly composed of polyurethane resin and silicon dioxide were formed thereover after chromate treatment, and the same cyclic corrosion test as described above was conducted. The results are as shown in FIG. 7.

Figure 7:
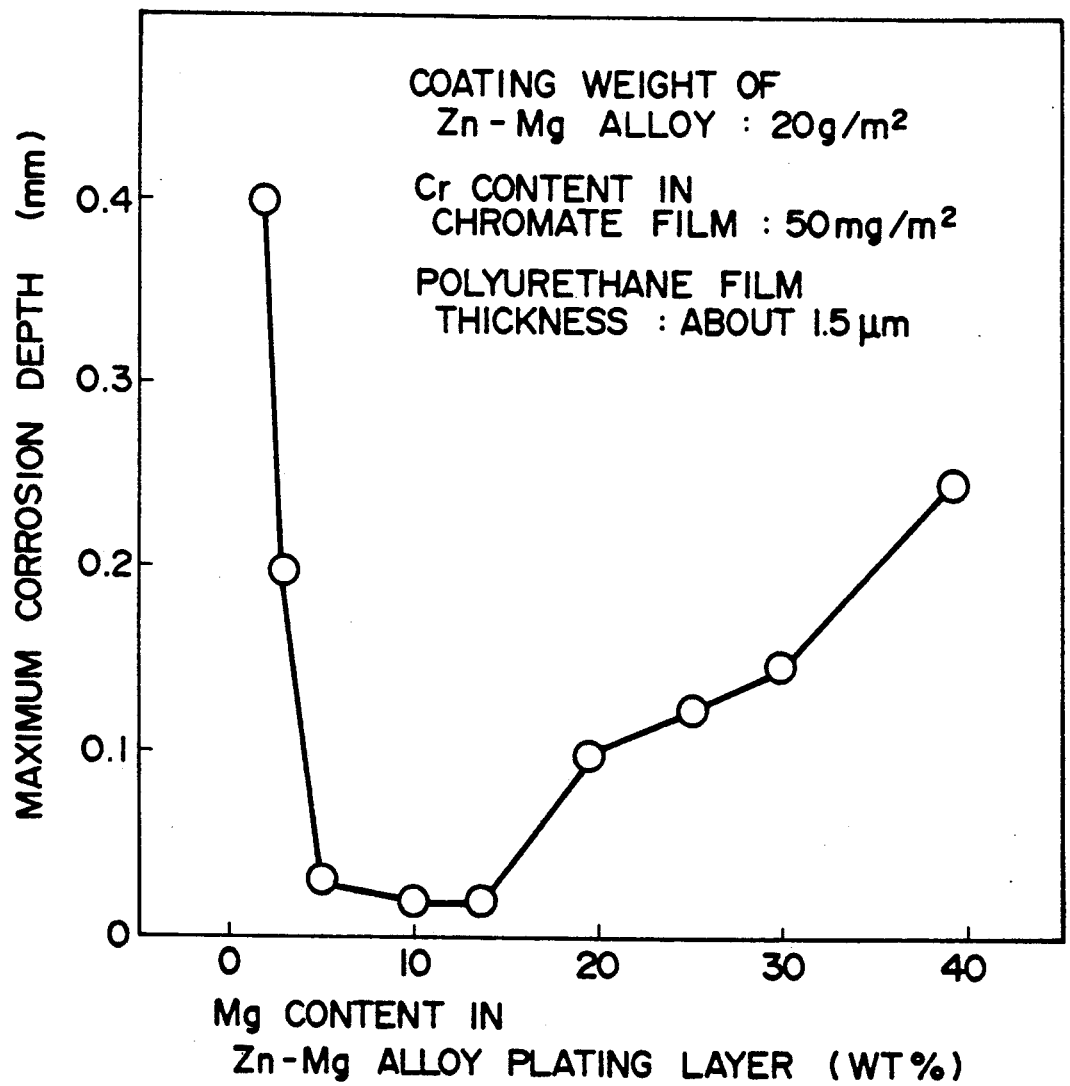
FIG. 7 shows a relationship between the Mg content in Zn-Mg alloy plating and the maximum corrosion depth of Zn-Mg alloy plated steel sheet in the cyclic corrosion test.

As apparent from FIG. 7, the Mg content in the Zn-Mg alloy plating has a great effect on the maximum corrosion depth and satisfactory corrosion resistance is shown within the range of Mg content from 5 to 15% and the corrosion resistance becomes poor if Mg content is less than 5% or exceeds 15%. However, since the cyclic corrosion test has been very severe, this result does not disprove the fundamental concept of the present invention of containing from 0.5 to 40% of Mg in Zn-Mg alloy layer. By the way, when the Zn-Mg alloy plated steel sheets are left for a long time in the atmospheric air, very thin oxide layers are formed on the surface thereof to deteriorate the adhesion of the polyurethane layers. Accordingly, excepting for the case where layers mainly composed of polyurethane and silicon dioxide are formed just after the application of Zn-Mg alloy plating, it is desirable to prepare a chromate treatment before coating of polyurethane layer a conducted in the aforementioned test in the case where there is a certain time lag until coating. In other words, if the polyurethane film layers, are applied successively just after the plating of Zn-Mg alloy layer the chromate treatment may be omitted.

As the result of this study made by the present inventors, the Zn-Mg alloy plated steel sheets on which layers mainly composed of polyurethane resin and silicon dioxide are formed are excellent in the corrosion resistance as compared with those sheets formed with layers comprising silicon dioxide and resins other than polyurethane resin, as for example, synthetic resins such as acrylic resin, epoxy resin or phenol resin. Further, satisfactory results can also be obtained for both the adhesion with paints and the electrodeposition coatability. Moreover, there is no peeling for polyurethane layer due to mechanical fabrication, etc. and this can provide excellent effects in the case of use by applying press molding such as for outer panels for use in vehicles.

The polyurethane resin used in the present invention can include reaction products, for example, between diisocyanate compounds and polyhydric hydroxy compounds and/or polyhydric amino compounds.

By the way, the film layers mainly composed of polyurethane resin and the silicon dioxide ma be formed as a mere mixed layer of both of them, but they may form as a composite material layer by the addition of a silane coupling agent. In the case where the composite material layer is formed, not only the film layer per se becomes strong but also the adhesion thereof to the substrate and the coating layer become more improved. Further, synthetic resin such as acrylic resin, epoxy resin, phenyl resin, etc. may be added depending on the situation and within a range as not to impairing the characteristic properties of the polyurethane layer. If required, a small amount of anti-rust pigment may be added to further improve the corrosion resistance. Further, by incorporating Zn powder, Zn-Mg alloy powder, Zn-Al alloy powder, Zn-Ni alloy powder, Zn-Fe alloy powder, etc. with the powder grain size of about less than 1 $\mu$m into polyurethane layer, the electrodeposition coatability, the spot weldability and the corrosion resistance can further be improved while providing electroconductivity without impairing the surface appearance and formability. Since the electrodeposition coatability is worsened in view of deteriorating the electroconductivity as the thickness of the polyurethane layer is increased, it is preferred that the thickness of polyurethane layer is less than 5 $\mu$m. However, in view of the improvement in corrosion resistance, the thickness is preferably less than 0.5 $\mu$m.

The method of chromate treatment can include, coating type chromate treatment method, reaction type chromate treatment method and electrolytic chromate treatment method, or which may be used in combination depending on the purposes for which is applied. For example, for the purpose of satisfying both the adhesion of the polyurethane film layer and the corrosion resistance, the chromate treatment is at first applied by the reaction type or coating type chromate method and the electrolytic chromate treatment is further applied thereupon.

The polyurethane film layer is formed by at first coating a liquid mixture mainly containing polyurethane resin, fine silicic powder and, if required, silane coupling agent or other additives by means of a usual coating method, drying and then baking if required.

As has been described above, another plating layer or various resin-series films are formed on the Zn-Mg alloy vapor deposited layer in accordance with the present invention to obtain their respective effects. For the pre-treatment of substrate before preparing the Zn-Mg alloy vapor deposition layer, various methods employed generally so far can be used. However, the following has been found the following as a result of various studies about pre-treatment excluding the conventional methods. The substrate metals, which are preheated in a nonoxidative atmosphere, subsequently formed pure Zinc plating layer or Zn alloy plating layer containing one or more of elements selected from Ni, Cu, Mg, Al, Fe, Co, Ti and Mn in an amount of less than 5% in total as alloying metals, and further formed thereover the Zn-Mg alloy vapor deposited layer, show extremely satisfactory formability, cause no peeling of plating upon press molding etc. and have stable corrosion resistance even after the forming.

The present invention has a basic constitution of Zn-Mg alloy vapor deposition plating, but it also includes vapor deposition plating of other Zn alloys, or ternary, quarternary or more element alloys as the pre-plating or post-plating for Zn-Mg alloy plating. In view of the above, explanation is to be made for the excellent technique of practicing the alloy vapor deposition plating by means of Zn-Mg alloy vapor deposition plating as a typical example.

Figure 8:
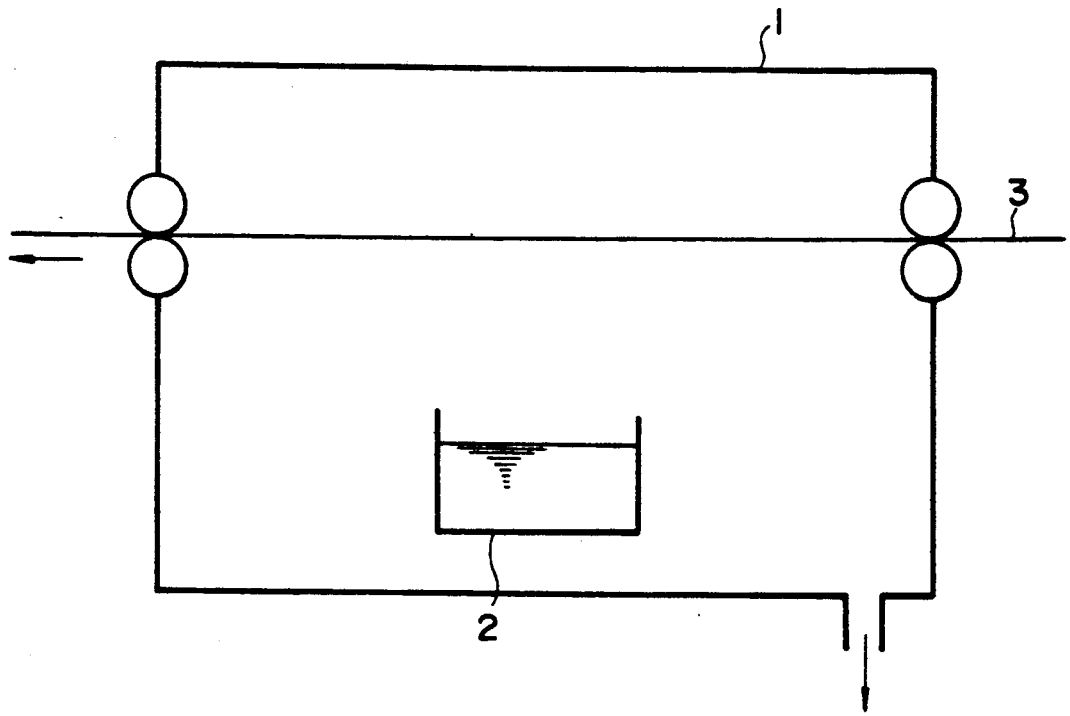
FIG. 8 is a view showing a method of manufacturing Zn-Mg alloy plated steel sheets by vapor deposition using a molten Zn-Mg alloy bath.

As a method of continuously producing Zn-Mg alloy plated steel sheets by means of vacuum vapor deposition, there may be considered a method, as shown in FIG. 8, of preparing an evaporization vessel 2 in a deposition chamber 1, charging Zn and Mg in admixture or charging Zn-Mg alloy in the evaporization vessel 2, heating to evaporize these metals under vacuum and the vapor depositing on a running steel sheets 3. However, since this method imposed regulation of the vapor pressure for each of the metals, it has been actually difficult to control the composition of vapor deposited layer.

Figure 9:
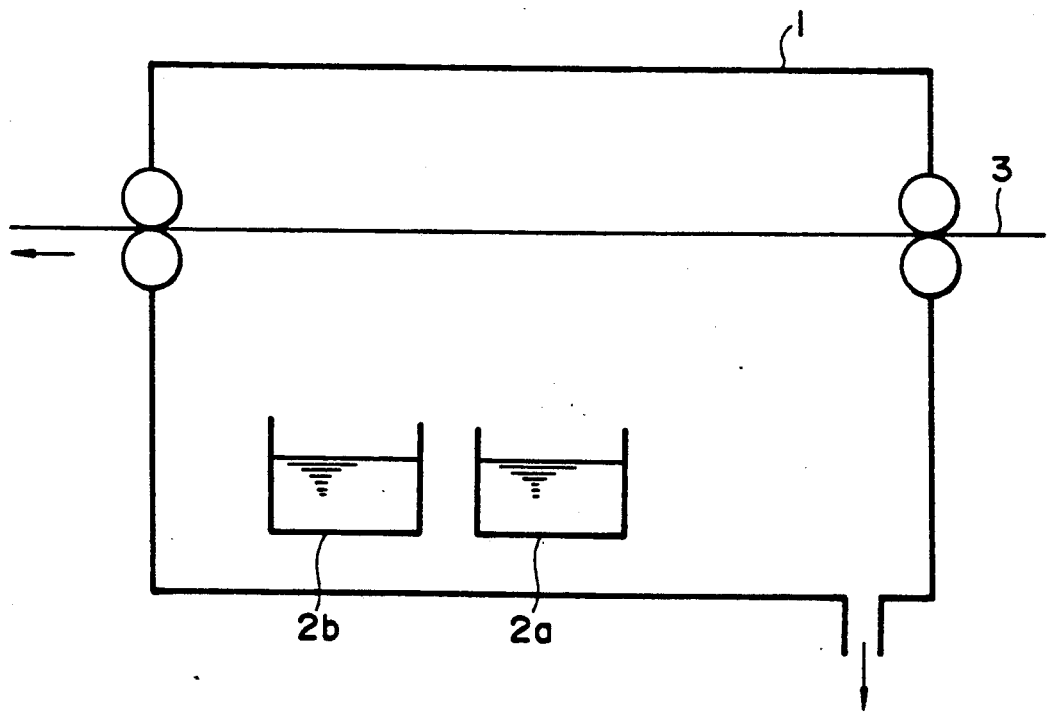
FIG. 9 is a view showing a method of manufacturing Zn-Mg alloy plated steel sheets by vapor deposition using a Zn bath and a Mg bath separately.

In view of the above, there may be considered a method as shown in FIG. 9 of preparing evaporization vessels 2a and 2b containing Zn and Mg separately in a deposition chamber 1, controlling the heating condition for the respective evaporization vessels independently thereby preparing vapors of mixed metals at a desired composition ratio and then vapor depositing them on the steel sheet 3.

Figure 10:
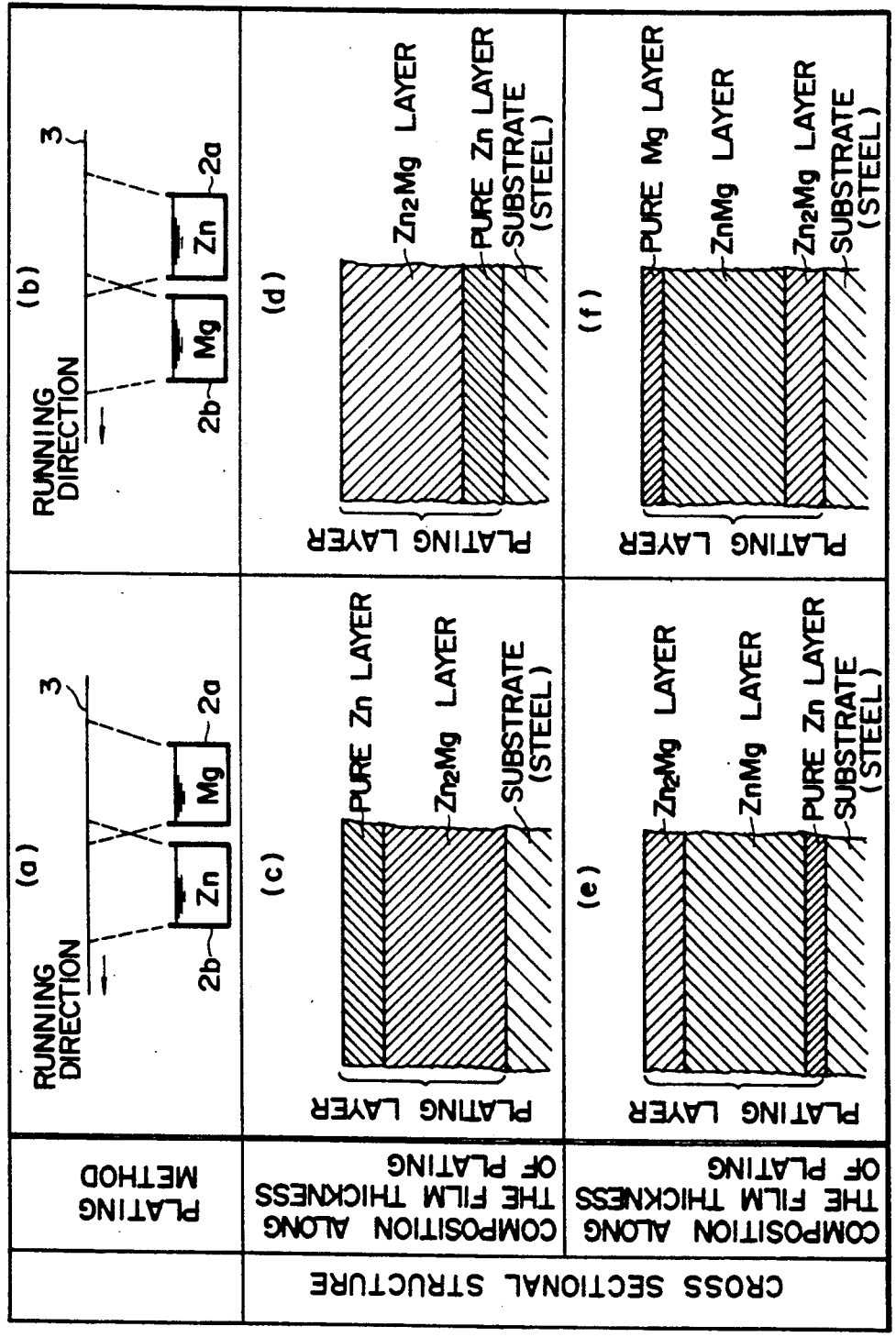
FIG. 10 is a view illustrating the cross section of Zn-Mg alloy plating layers obtained by the method shown in FIG. 9.

According to the study of the present inventors, etc., it has been found that the Zn-Mg alloy vapor deposited layer obtained by the latter method does not form a uniform ingredient composition along the in-depth direction of the Zn-Mg alloy layer. For instance, it has been found that upon preparing Zn-10%Mg (% by weight here and hereinafter) alloy vapor deposited steel sheets, if an evaporization vessel 2a is arranged as shown in FIG. 10(a) containing Mg (Zn in FIG. 10(b)) to the incoming side of the running steel sheet 3, while arranging an evaporization vessel 2b containing Zn (Mg in FIG. 10(b)) to the outgoing side of the running steel sheet 3 and, when vacuum deposition plating is conducted, vapor deposited layer with the cross section as shown in FIG. 10(c) (or (d)) is formed. Furthermore, it has been found that if Zn-35%Mg alloy vapor deposited steel sheet are prepared in the foregoing arrangement for the evaporization vessels, the Zn-Mg alloy plating layer as shown in FIGS. 10(e) and (f) can be obtained.

As apparent from FIGS. 10(c), (d), (e) and (f), the composition in the plating layer changes along the direction of the layer thickness. For instance, in FIGS. 10(c) and (d), the structure comprises pure Zn layer and the $Zn_2Mg$ layer in FIGS. 10(c) and (d) (the vertical relationship is reversed in (c) and (d)), whereas the structure comprises a pure Mg layer, a ZnMg layer and a $Zn_2Mg$ layer in FIGS. 10(e) and (f) (the vertical relationship is reversed in the same manner as above in (e) and (f)).

In a case where the composition in the plating layer changes along the direction of the layer thickness, it gives undesired effects on the formability, corrosion resistance or weldability in the plated steel sheets as described later.

As has been described above, although excellent formability is required for the Zn-series plated steel sheets, if the hardness in the Zn-Mg alloy plating layer is not the same along the cross section in the plating layer because of having such a multi-layered structure in which the composition changes gradually along the cross section, there is a problem that inter-layer peeling such as flaking is caused during deformation thereby lowering the formability.

In a case that a pure Mg layer is present on the side of the substrate steel sheet as shown in FIG. 10(e), if pin holes, etc. are present in the plating layer, the lowermost pure Mg layer is preferentially corroded under a corrosive circumstance where chlorine ions, etc. are present, which causes blisters in the plating layer due to generation of $H_2$ gases, and finally leads to an extremely undesired phenomenon that the plating layer is peeled from the substrate steel sheet.

Furthermore, in a case that the pure Mg layer is present to the uppermost surface as shown in FIG. 10(f) (when the plated steel sheet is usually used after coating), the Mg layer is dissolved selectively between the coating film and the plating layer (anode reaction) and, accompanying therewith, $H_2$ gas is generated cathode reaction) to cause blistering in the coating film (anode blister and cathode blister) and peeling of coating film. Accordingly, it is actually impossible to apply them to outer panels for use in vehicles and home electronic or electrical products.

The present inventors have made various studies or means for obtaining Zn-Mg alloy vapor deposited steel sheets in which the composition ratio is uniform along the direction of the thickness of the plating layer. As a result, it has been found that if mixed vapors of both Zn vapors and Mg are formed in a predetermined ratio, they are vapor deposited to the surface of the steel sheet to form an alloy vapor deposited layer of a uniform composition ratio.

Figure 11:
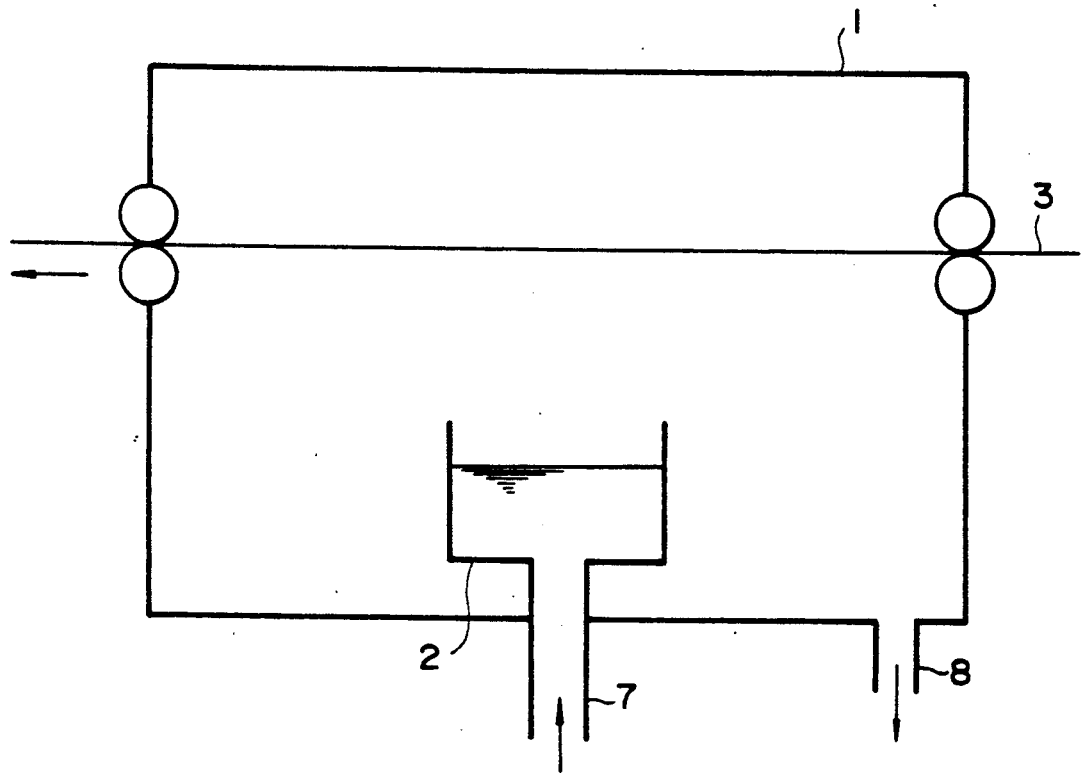
FIG. 11 is an illustrating view for practicing the method of the present invention using a molten Zn-Mg alloy bath.

Specifically, as shown in FIG. 11, an evaporization vessel 2 is arranged in a vapor deposition chamber 1 and raw material feeder pipe 7 is connected with the bottom of the evaporization vessel 2 because of the reason as described later. Then, a Zn-Mg alloy of a predetermined composition ratio is prepared in the evaporization vessel 2, and vapors of a uniform composition is obtained and fill the vapor deposition chamber 1. In this condition, a Zn-Mg alloy layer at a constant and uniform composition is vapor-deposited on a steel sheet 3 running in the direction of the arrow mark, at a predetermined composition along the direction of the thickness. In FIG. 11, reference numeral 8 denotes an evacuation pipe.

In this case, the composition for the Zn-Mg alloy bath in the evaporization vessel 2 does not coincide with the composition of the plating layer on the steel sheet. As a result of the study made by the present inventors, there is a relationship between the composition of the Zn-Mg alloy bath and the composition of the vapor-deposited layer as shown in FIG. 12, at No. 1, No. 2 and No. 3 for instance. That is, referring to the relationship between the composition for the Zn-Mg alloy bath and the resultant plating layer structure, the bath composition is Zn-71%Mg, whereas the plating layer composition is Zn-64%Mg in No. 1, and the structure of the plating layer is an eutectic crystal state of a ZnMg phase and a Mg phase as a mono-layered structure. In No. 2, the bath composition is Zn-49%Mg, whereas the plating layer composition is Zn-33%Mg, and the structure of the plating layer is mono-layered structure comprising ZnMg phase. Further, in No. 3, the bath composition is Zn-34%Mg, whereas the plating layer composition is Zn-21%Mg, and the constitution of the plating layer comprises mono-layered structure comprising $Zn_2Mg$ phase.

Accordingly, in order to obtain a plating layer of a desired composition ratio, the alloy composition for Zn-Mg bath is adjusted to such a composition ratio as capable of obtaining a desired plating layer composition (by means of experiment), to obtain vapors of a uniform composition and thus obtain a plating layer of an aimed alloy composition. However, since Zn has a higher vapor pressure than Mg in the Zn-Mg alloy bath, Zn is more vaporizable. Therefore, the Mg concentration in the evaporization vessel 2 is increased with passage of plating time and the bath composition can no more be held constant. In view of the above, raw metals (Zn or Zn-Mg alloy) are melted outside of the vapor deposition chamber 1 and molten metal is fed by way of the feeder pipe 7 in FIG. 11 so as to maintain a desired bath composition.

The method of feeding raw materials to the evaporization vessel includes a feeding method in a solid state and a feeding method in a molten state. In view of the industrial production process, it is preferred that the raw material is fed continuously. To feed raw material in molten state is easier than to do in solid state, because if solid material (particle, block, sheet, wire, etc.) is to be continuously fed from the atmosphere into the evaporization vessel in the deposition chamber, it has to be fed by way of a vacuum lock chamber (vacuum sealing device), which makes the vapor deposition apparatus complicate and increase the installation cost. In this regard, the method of continuously feeding raw material in the molten state to the evaporation vessel is easier as compared with the one of feeding solid state material and various methods have already been put to practical use. Accordingly, the raw material in the molten state is supplied to the evaporation vessel in accordance with the customary method as well as in the process of the present invention.

Figure 13:
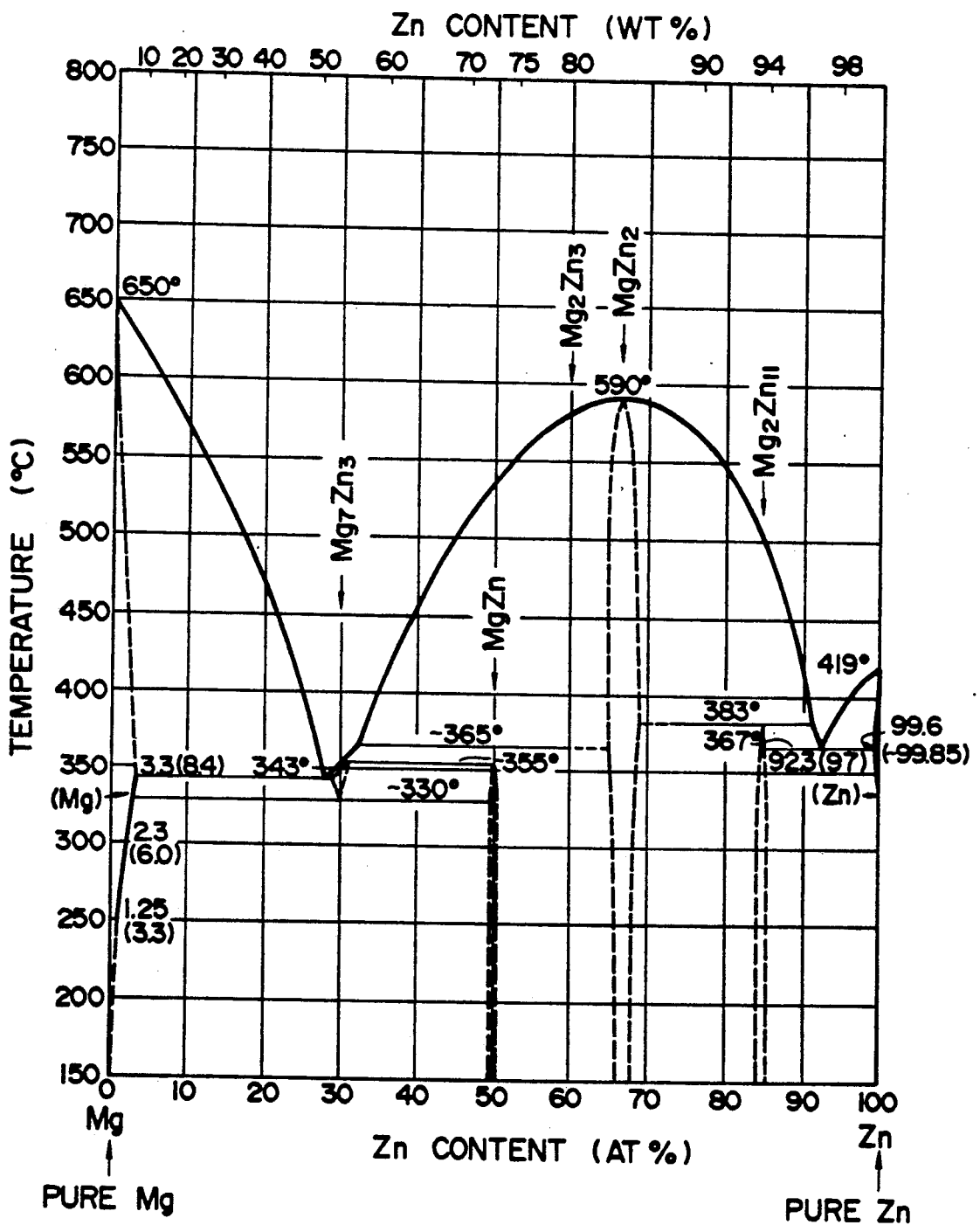
FIG. 13 shows a relationship between a composition and the melting point of Zn-Mg alloy (including the case: Zn=0%, Mg=0%)

The equilibrium diagram of pure Zn, pure Mg and Zn-Mg alloys of various compositions are as shown in FIG. 13. In view of the diagram, since the melting point for pure Zn is 419° C., the melting point for pure Mg is 650° C., the melting points for various kinds of Zn-Mg alloys are 340°-600° C., which are relatively low, it is preferred in view of the nature of the process to melt the respective metals in a melting vessel (not illustrated) and feeding them by way of the feeder pipe 7 continuously into the evaporization vessel. However, in the case of melting Zn, Mg, Zn-Mg alloys by heating in the atmospheric air, since they are easily oxidized and the dross causing reduction in the yield is formed. Further since Mg or Zn-Mg alloys of particularly high Mg content are radically oxidized, ignition may sometime occur to cause a problem rendering the operation unsafe. Accordingly, when melting these raw materials by heating, it is necessary for such means as sealing the molten bath surface with an inert gas such as $N_2$ gas thereby prevent oxidation, or covering the surface of the molten bath with sulfur type fluxes to isolate the surface of the molten bath from the atmospheric air.

Figure 14:
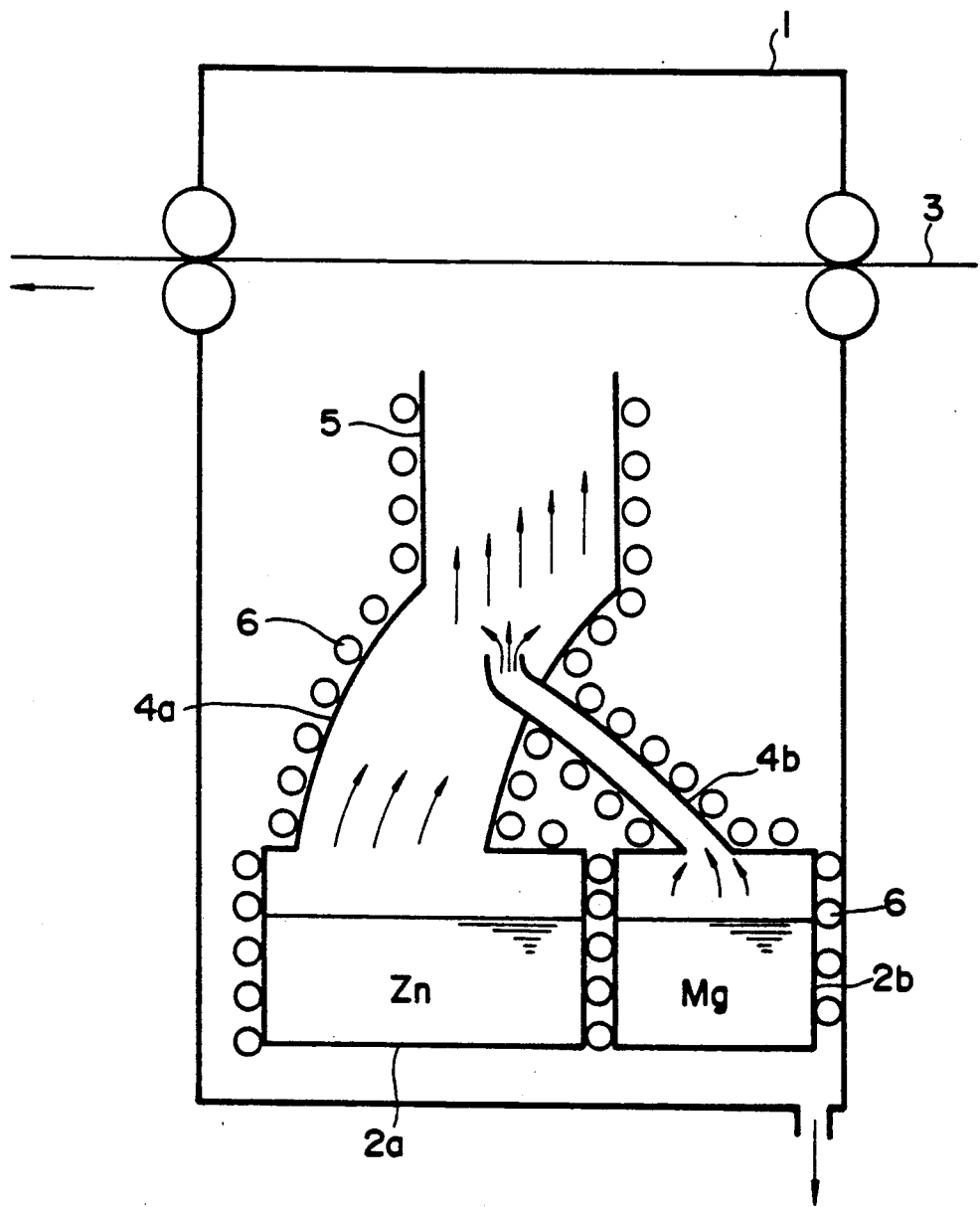
FIGS. 14 and 15 are schematic diagrams, respectively, showing a method of producing Zn-Mg alloy plated steel sheets by mean of the present invention which vapor deposition is performed by vaporizing from both a Zn bath and a Mg bath.
Figure 15:
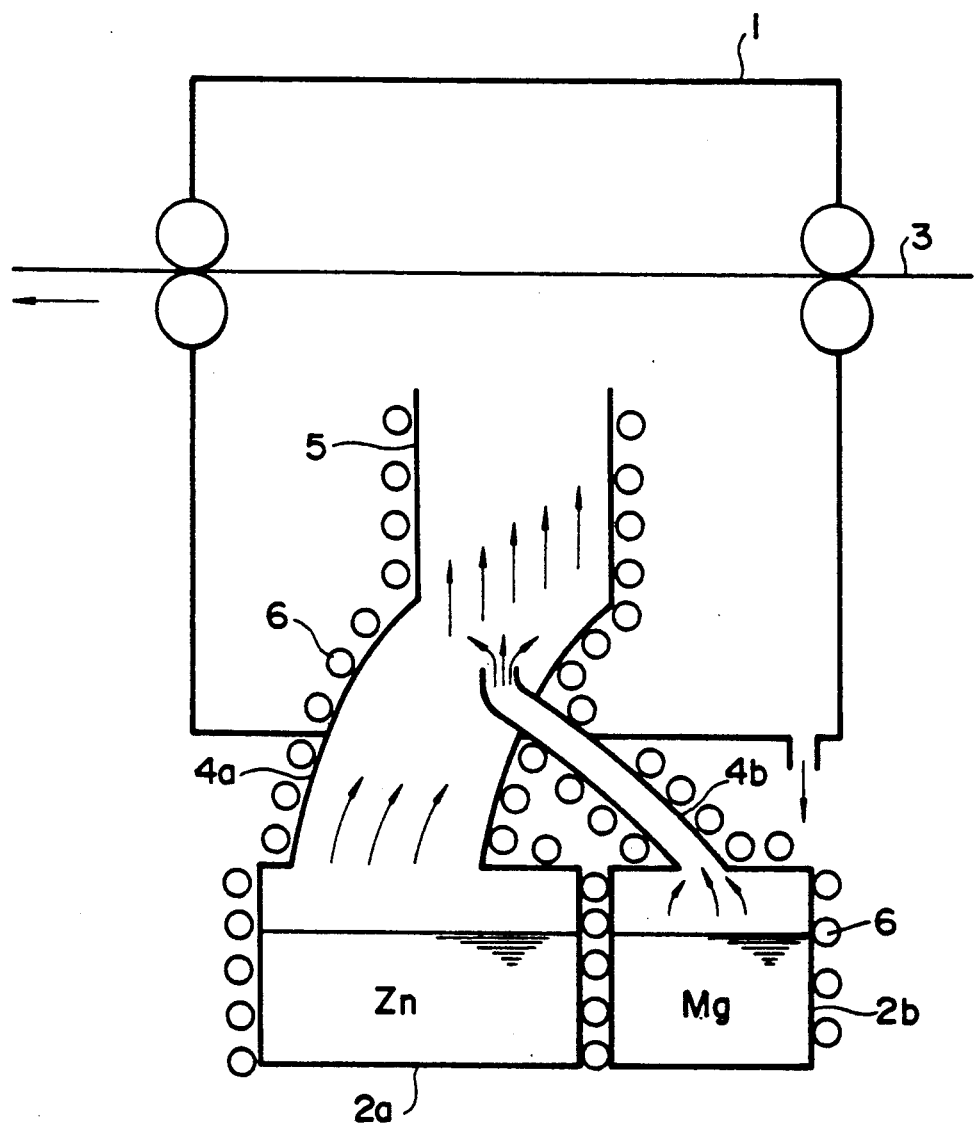

Further, the vapor composition of Zn and Mg at a predetermined ratio can be formed as described below. That is, as shown in FIG. 14 or 15, Zn and Mg are vaporized from respective evaporation vessels 2a and 2b, vapors of Zn and Mg are introduced by way of ducts 4a and 4b disposed to the evaporation vessels respectively to a mixing duct 5, uniformly mixed during passage through the mixing duct 5 and then vapor deposited on a steel sheet. FIG. 14 shows a case of preparing the evaporization vessels 2a and 2b inside the vapor deposition chamber 1, whereas FIG. 15 shows a case of preparing outside of the chamber.

Figure 16:
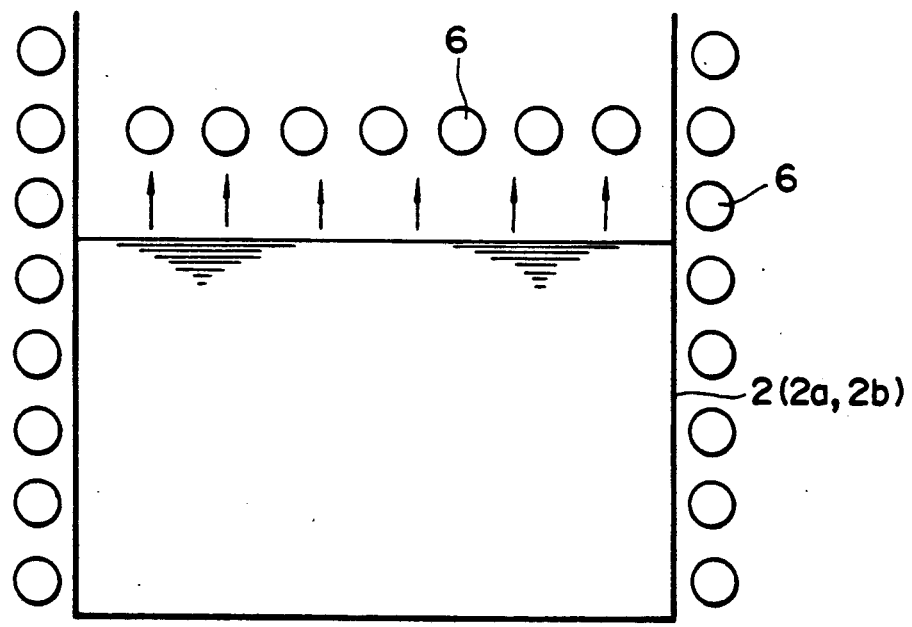
FIG. 16 shows a method of heating the bath.

When heating the evaporation vessels for obtaining vapors of Zn and/or Mg in each of the vapor deposition methods described above, it is preferred to apply heating by arranging heaters 6 above the molten surface of the raw material bath as well as at the periphery of the evaporization vessel 2 (2a and 2b) as shown in FIG. 16. Since it is desirable that Zn or Mg vapors are generated from the surface of the bath, the outermost surface of the bath is kept at the highest temperature. If the temperature at the bottom of the bath is higher than that at the surface of the bath, splash may be easily generated and it is difficult to maintain the evaporization amount constant. Moreover, if Zn or Mg vapors formed by splash are deposited as such on the steel sheet, it makes the appearance of the plated surface defective and brings about a problem in the products. Heating for the ducts 4a, 4b is described below.

As heating means for the evaporation vessel, there can be mentioned various ohmic heating systems such as nichrome wire heater, cantal heater, molybdenum heater, etc., electron beam (EB) heating system or RF heating system. Since the equilibrium vapor pressure of Zn and Mg under vacuum is high, a sufficient amount of evaporization can be obtained without using the EB or RF heating system but by the ohmic heating system, and Zn-Mg series alloy vapor deposited steel sheets can be manufactured at an industrially satisfactory plating rate by these ohmic heating systems. The ohmic heating system is preferred also in view of the initial cost running cost, working life, maintenance of the heating source, as well as in view of the structure of the vapor deposition chamber.

Upon producing Zn-Mg alloy plated steel sheets by vapor deposition method, since the vapors of vaporized Zn and Mg are deposited to the inner wall surface of the vapor deposition chamber, the inner wall surface of the vapor mixing duct, etc., frequent maintenance and cleaning are required for the inside of the vapor deposition chamber etc., by breaking the vacuum state and interrupting the plating operation, which may sometimes cause problems in manufacturing.

For overcoming such problems, the present inventors have tested for the deposition of the vapors by disposing heaters 6 around the vapor deposition chamber (not illustrated) or at the periphery of the duct to heat the inner wall surface of the vapor deposition chamber or the wall surface of the duct thereby changing the heating temperature. The results are shown in Table 1. As can be seen from Table 1, it is necessary to heat the inner wall surface of the vapor deposition chamber or the inner wall surface of the duct and maintain them at a temperature higher than 650° C., preferably, 700° C. in order not to deposit the vapors of vaporized Zn and Mg.

In this case, the steel sheet is conducted to the vapor deposition chamber after preheated to 200°-250° C. The major factor for raising the temperature of the steel sheet is the sensible heat and latent heat due to deposition of Zn and Mg vapors, while the elevation of the temperature of the sheet due to the radiation heat from the vapor deposition chamber maintained at a high temperature is much smaller as compared with the factor described above (as seen from calculation and experience). Accordingly, even if the temperature inside the vapor deposition chamber is from 650° to 700° C., no problems arise for producing Zn-Mg alloy vapor deposited steel sheet.

Further, when the pressure is sufficiently low as in the case of vacuum deposition, if the temperature at the wall surface is higher, even a little, than the temperature of the Zn and Mg vapors, the vapors are not deposited to the walls. The temperature of the mixed Zn and Mg vapors is considered to be about 650° C. (actually about 600° C.) and neither Zn nor Mg is deposited to the wall surface if the latter is heated to a temperature higher than above. That is, if the inner wall surface of the vapor deposition chamber and the inner wall surface of the duct are heated to the above-mentioned temperature, there is no requirement for the frequent maintenance or cleaning of the apparatus including the vapor deposition chamber.

TABLE 1

| No. | Heating temperature for wall surface (°C.) | Vaporizing condition | Deposition of vapors Zn | Mg |
|---|---|---|---|---|
| A | 300 | Zn and Mg are vaporized from respective evaporation vessels and mixed | X | X |
| B | 400 | | X | X |
| C | 500 | | X (little) | X |
| D | 550 | | O | X |
| E | 600 | | O | X (little) |
| F | 650 | | O | X (little) |
| G | 700 | | O | O |
| H | 300 | Zn and Mg mixed vapors are generated from Zn-34% Mg alloy bath | X | X |
| I | 400 | | X | X |
| J | 500 | | X (little) | X |
| K | 550 | | O | X |
| L | 600 | | O | X (little) |
| M | 650 | | O | O |
| N | 700 | | O | O |

X Deposited
O Not deposited

Figure 17:
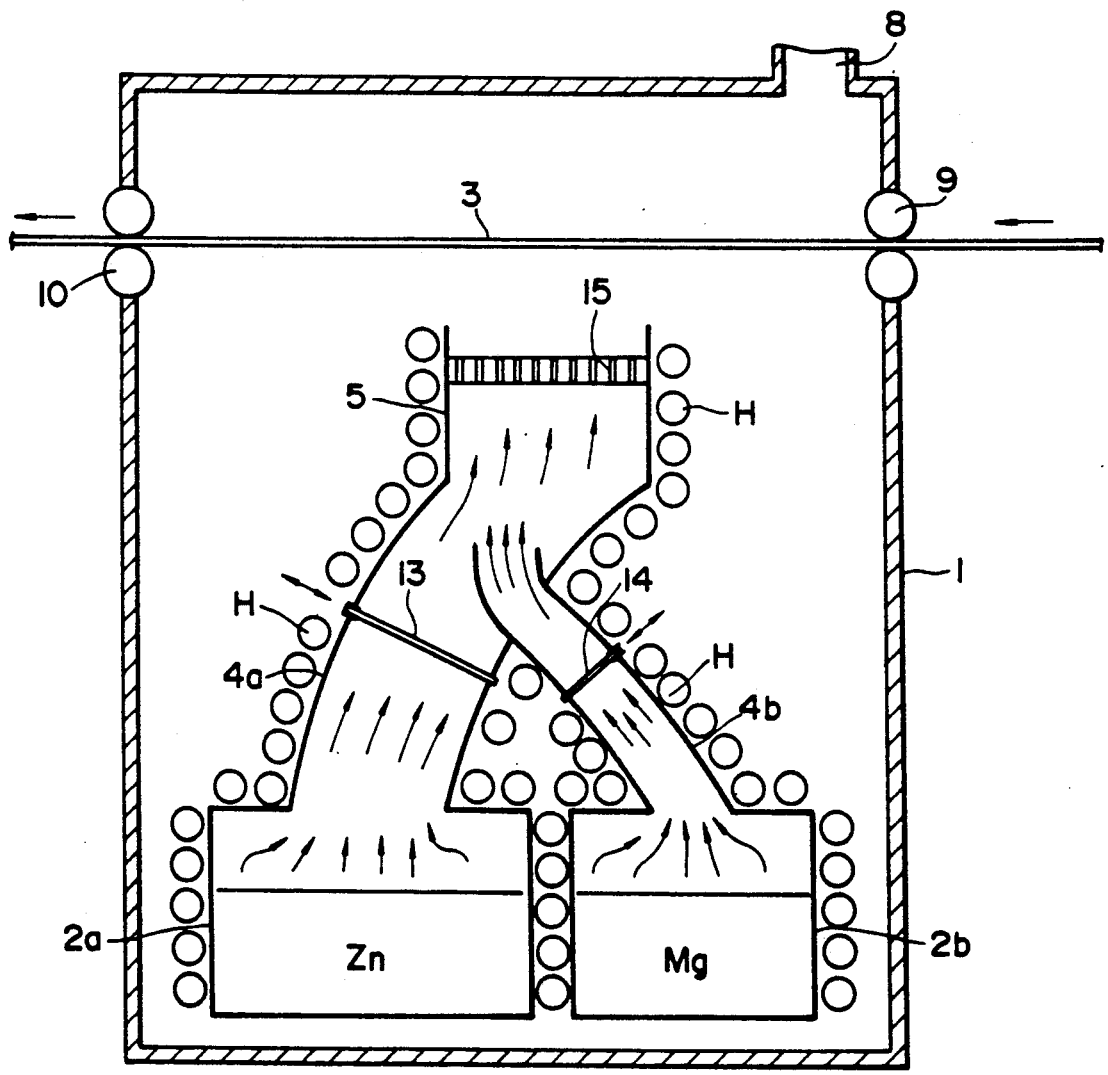
FIG. 17 is a schematic view showing an embodiment of vapor deposition improved from that in FIGS. 14 and 15.

FIG. 17 shows a conceptional view for the device improved from that shown in FIG. 15, in which are shown sealing rolls 9, 10, movable shutters 13, 14 and a rectification plate 15. Specifically, evaporation vessels 2a and 2b prepared exclusively for Zn and Mg, respectively, are connected with vapor ducts 4a and 4b, to which the movable shutters 13 and 14 are installed so that the amount of Zn vapors and Mg vapors sent to the downstream for each of the ducts 4a and 4b can be adjusted. The vapor ducts 4a and 4b are joined at the downstream of the movable shutters 13 and 14 to constitute a joined duct 5. The rectification plate 15 is installed to the joined duct 5 on the side open. Upon carrying out Zn-Mg alloy vapor deposition plating by using this device, the steel sheet 3 runs through the sealing rolls 9 and 10 while conducting evacuation through the evacuation port 8. Meanwhile, the evaporization vessels 2a and 2b are heated by appropriate heating source to vaporize Zn and Mg. The respective vapors are conducted from the ducts 2a and 2b through the movable shutter 13 and 14 toward the joined duct 5. In this case, by controlling the opening degree of the movable shutter 13 and 14, the amount of the Zn vapors and Mg vapors passing therethrough are adjusted to control the vapor composition in the joined duct 5. The composition mixture of Zn and Mg is mainly adjusted by the degree in the vapor deposition chamber 1 and the heating temperature for each of the evaporization vessels. Since the adjustment of the degree vacuum or the heating temperature can not always be made with high accuracy, control by the movable shutter 13 and 14 is necessary in addition to the above-mentioned main control.

The Zn vapors and Mg vapors thus joined in the joined duct 5 are further mixed uniformly in the course of passing the rectification plate 15 made of plate full of holes, etc. and then plated by vapor deposition in a uniformly mixed state on the steel sheet 2 which is running above the joined duct 5.

In the case of using such a vapor deposition plating device, not all of the metal vapors generated from the evaporization vessels 2a and 2b are plated to the surface of the steel sheet, but a portion of the vapors are deposited to the wall surfaces of the ducts 4a, 4b and 5, movable shutter 13 and 14 and, further, rectification plate 15, etc. This not only reduces the yield of vapors but also necessitates frequent cleaning operation for the removable of deposits. If Zn and Mg are deposited and alloyed on the wall surface of duct, etc., the alloy is not evaporized again. This phenomenon is very disadvantageous to cause loss of metals for plating. Accordingly, in order to avoid such a problem, heaters H are installed around the ducts 4a, 4b and 5, the movable shutter 13 and 14, the rectification plate 15, etc., which are arranged from the evaporization vessels 2a and 2b to the top of the joined duct 5 as shown, for example, in FIG. 17, to heat them at a temperature higher than the temperature of vapor metals, so that vapor deposition of metals do not occur on the wall surfaces. In this case, there is no restriction for the heating system and ohmic heating system, for example, nichrome heater, cantal heater, or ceramic heater is generally used.

Such a vapor deposition plating process may be conducted under an atmospheric circumstance depending on the kind of metals but it is usually conducted in a nonoxidative atmosphere to avoid oxidation loss of metal vapors, etc., specifically, in a vacuum atmosphere or inert gas atmosphere such as nitrogen, argon, helium, etc. Particularly, since Mg radically reacts with oxygen to be oxidized and burnt, vapor deposition in the nonoxidative atmosphere is indispensable.

As another problem in the case of using Mg as the alloying metal for the alloy plating, there can be mentioned that the subtle adjustment for the composition of the alloy plating containing Mg is difficult since the saturated vapor pressure of Mg is extremely high and the amount of Mg vapors passing through the shutter changes greatly even by a slight difference in the degree of opening in between the shutter. Such a problem can be easily solved by making the movable shutter 14 installed to the Mg vapor duct 4b as a multiple structure thereby applying multiple (double, triple, etc.) control for the amount of the Mg vapors passing therethrough.

Figure 18:
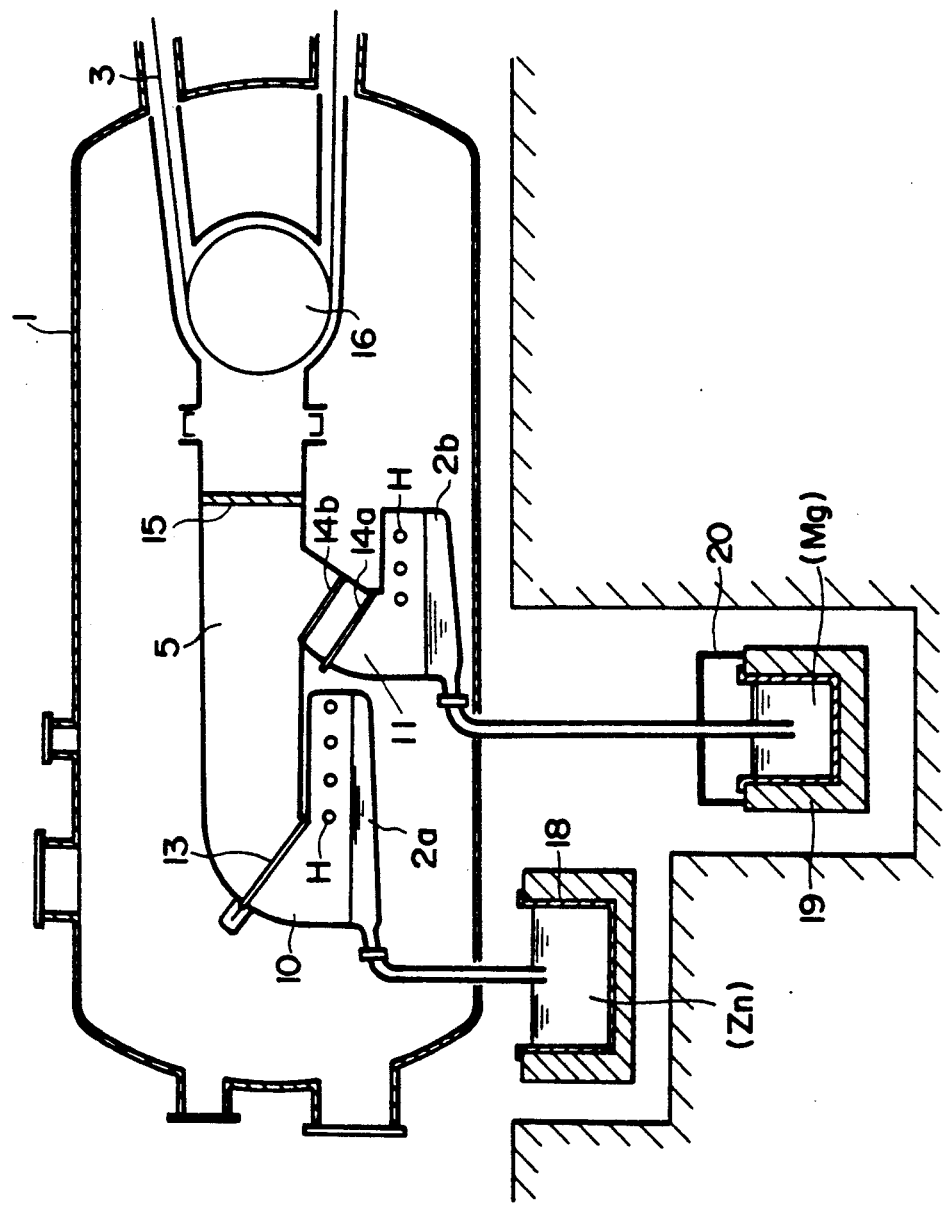
FIGS. 18 to 20 are, respectively, schematic cross sectional views illustrating other embodiments.

FIG. 18 shows a schematic cross sectional view for the explanation of another embodiment according to the present invention. Since the fundamental arrangement is the same as that for the embodiment shown in FIG. 17, the identical portions carry the identical reference numerals and duplicate explanations therefor are omitted. The embodiment shown in FIG. 18 is different from that shown in FIG. 17 at first with respect to the running means for the steel sheet 3 as the material to be plated. In this embodiment, the steel sheet is introduced into deposition chamber 1 by means of a deflector roll 16 prepared in the vapor deposition chamber 1 and continuously applied with vapor deposition plating by mixed vapors conducted from the left in the drawing. Another difference is that a Zn melting vessel 18 and a Mg melting vessel 19 are prepared to the outside of the vapor deposition chamber 1 separately from the Zn evaporization vessel 2a and the Mg evaporization vessel 2b, so that Zn and Mg may gradually be fed to the Zn evaporization vessel 2a and the Mg evaporization vessel 2b as Mg and Zn are consumed as vapors. This embodiment is adapted such that the respective molten metals are automatically introduced from the respective melting vessels 18 and 19 to the evaporization vessels 2a and 2b by the pressure difference between the melting vessels 18, 19 and the evacuated vapor deposition chamber 1. Since the specific gravity of the Mg is lower, the Mg melting vessel 19 is arranged much lower than the Zn melting vessel 18. However, the means for feeding molten metals are not restricted only to such a method, but the feeding amount of Mg can be controlled as shown, for example, in FIG. 19, by connecting a vacuum pump 21 for reducing pressure to a cover 20 for sealing the Mg melting vessel 19 from the atmospheric air and by controlling the pressure applied to the molten surface of the melting vessel 19 depending on the pressure in the vapor deposition chamber 1, or the feeding amount can be controlled by the pressure of the inert gas used for the prevention of oxidation. Further, in the embodiment shown in FIG. 18 or 19, the movable shutter installed to the Mg duct 4b is made as a double structure so that the amount of the Mg vapors passing therethrough can be adjusted at a higher degree of accuracy to thereby control the plating composition more correctly.

Figure 19:
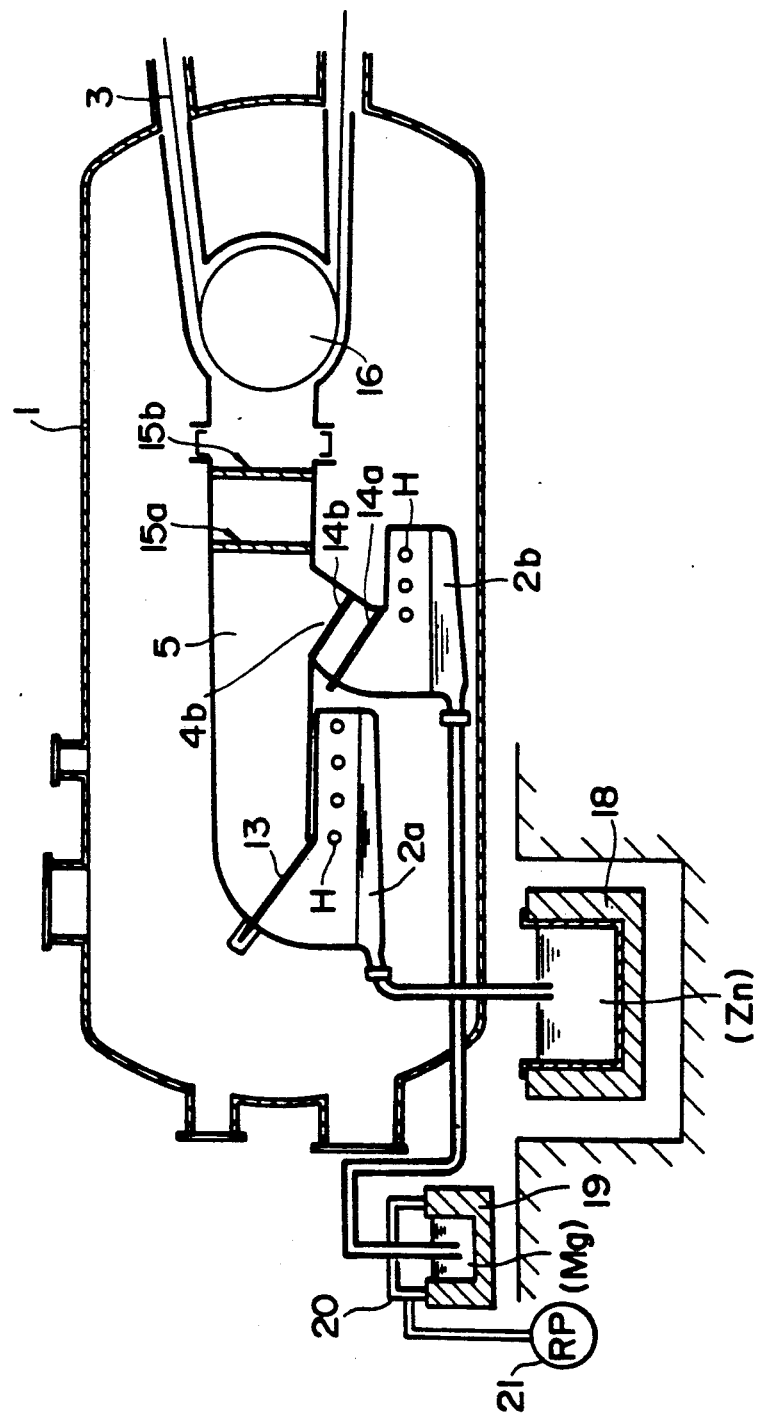

The rectification plate 15 installed in the joined duct 5 in the present invention has no particular restrictions or limitations at all for its specific structure so long as it can provide a rectifying effect of uniformly mixing the metal vapors, as well as eliminating localized flows of metal vapors thereby supplying the mixed vapors uniformly toward the surface of the steel sheet. If necessary, it is also effective to arrange rectification plates 15a and 15b in a double (or triple or more) structure to improve the rectifying effect as shown in FIG. 19.

Figure 20:
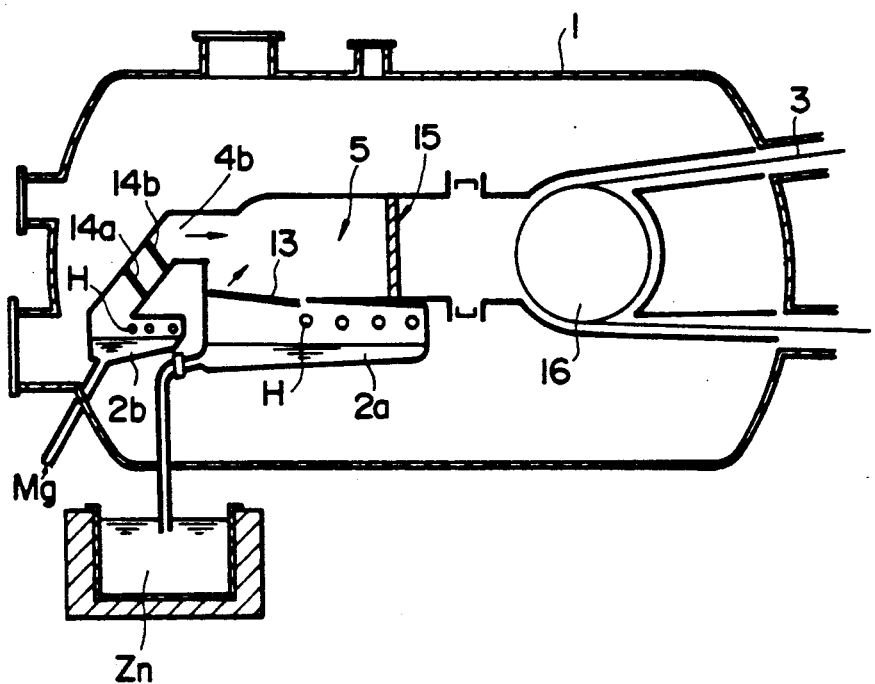

FIG. 20 shows an embodiment in which a Mg vapor duct 4b is directed to the axial center of the mixing duct 5, while the Zn vapor duct 4a is directed in the direction perpendicular thereto, so that Zn and Mg vapor flows are colliding against with each other at an abrupt angle to thereby improve the mixing performance.

In addition, it is also possible to modify the design for the shape and the structure of the vapor deposition chamber, the delivering means for the plated material, the shape and the heating means for the evaporization vessel, the shape and structure of the vapor duct and the movable shutter, etc. within such a range as not departing the purport as described below, all of which are contained within the technical scope of the present invention. Further, although explanation has been made in the foregoing descriptions mainly for the case of producing Zn-Mg alloy vapor deposition plating, the present invention is not restricted at all by the kind of the metals and it is of course possible to apply to the present invention to vapor deposition plating of alloys comprising three or more metals.

Techniques for depositing Zn vapors and Mg vapors in a uniformly mixed state on a metal material have been described in the foregoing explanations, and a Zn-Mg alloy plating layer comprising uniformly mixed Zn and Mg is formed at the surface of the metal material by these techniques. According to the study of the present inventors made apart from these techniques, it has been found that even if the Zn vapor deposited layer and the Mg vapor deposited layer is formed in a laminated state, Zn and Mg are mutually diffused to form a homogenous Zn-Mg alloy layer by heating the laminated layer and holding it at a temperature higher than 250° C.

That is, the following Table 2 shows the results of the experiment of forming plating layers (laminate) comprising Zn-15%Mg on the substrate steel sheet by means of a vapor depositing plating method, then holding the plated steel sheet at 150°-400° C. for 30 min by heating and examining the presence of Zn and Mg in each of the plating layers. As apparent from the table, if the heating temperature is less than 200° C., pure Zn layer and pure Mg layer remain together with Zn-Mg alloy in the plating layer to show insufficient mutual diffusion. On the other hand, if the heating temperature is set to higher than 250° C., it can be confirmed that the pure Zn layer and the pure Mg layer in the plating layers are completely eliminated due to the mutual diffusion and the plating layer is changed into the substantially uniform Zn and Mg alloy.

TABLE 2

| Heating and maintaining temperature (°C.) | Constitution of the plating layer | | | |
|---|---|---|---|---|
| | Zn | $Zn_{11}Mg_2$ | $Zn_2Mg$ | Mg |
| 150 | Y | N | Y | Y |
| 200 | Y | Y | Y | Y |
| 250 | N | N | Y | N |
| 300 | N | N | Y | N |
| 400 | N | N | Y | N | heating time: 30 Min.
Y: present
N: not present

As apparent from Table 2, even if a laminate plating layer consisted of Zn layer and Mg layer is initially formed, mutual diffusion of Zn and Mg occur in the laminate plating layer if they are heated and held at a temperature higher than 250° C. and finally form uniform Zn-Mg alloy of a composition corresponding to the initial ratio of the Zn and Mg contents for the plating layer. As a result, it is possible to prevent peeling of the plating layer or blister of the coating films and the active dissolution of Mg (anode reaction) due to the evolution of hydrogen accompanying therewith (cathode reaction) because of the presence of the pure Mg layer or phase as pointed out for the conventional method. It is possible to prevent inter-layer peeling during formation caused by the difference of the hardness in the plating layer, thereby enabling to provide an ideal Zn-Mg alloy plated steel sheet.

Since the heating and holding time for the mutual diffusion varies depending on the heating temperature, a total thickness of the plating layer, etc. it can not be defined simply, but a time of about 3–10 minutes is sufficient under most general conditions for heating and holding the temperature of 300°-350° C. Although there is no particular upper limit for the heating and holding temperature so long as it is lower than the melting point of Zn, Zn-Mg alloy and Mg, a temperature lower than 500° C. is preferred in view of the changes of mechanical properties due to the thermal effect to the substrate, etc.

Figure 21:
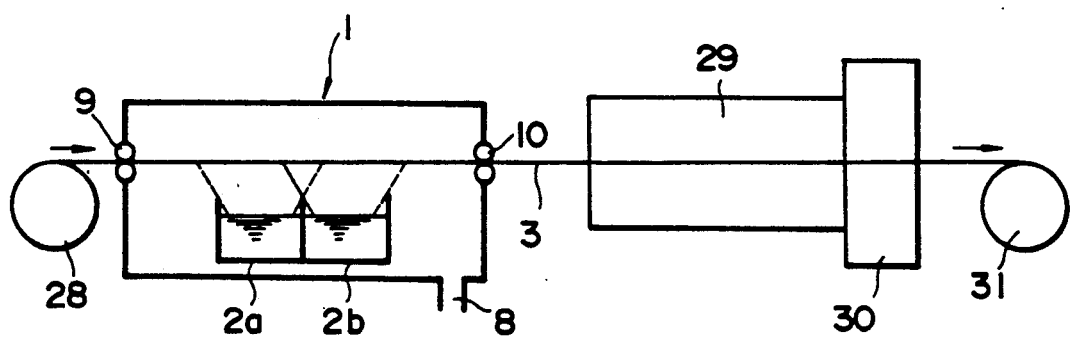
FIGS. 21 and 22 are conceptional views, respectively, for embodiments in which Zn and Mg are vaporized from separate baths for vapor deposition and then diffused by heat treatment after deposition.
Figure 23:
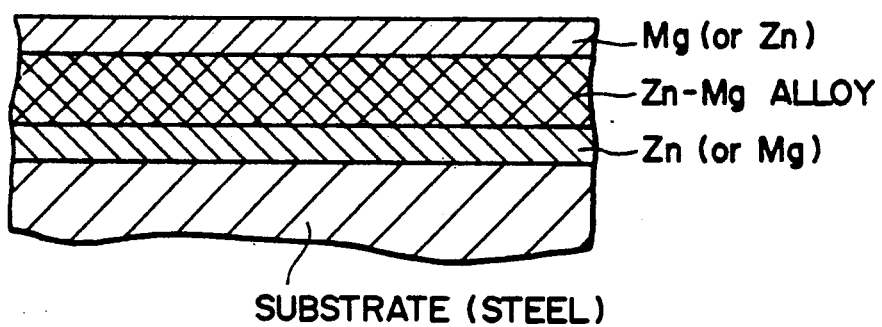
FIG. 23 shows a cross sectional view of a Zn-Mg plating layer having uniform in-depth profile for Zn and Mg.

FIG. 21 shows an embodiment according to the present invention employing the vapor deposition process for the formation of the laminate plating, in which a steel sheet 3 delivered from a dispensing reel 28 is introduced by way of sealing rolls 9 in a vapor deposition chamber 1 and Zn and Mg vaporized from evaporizing vessels 2a and 2b are vapor deposited on the steel sheet 3. In this case, the vapor-deposited plating layer forms a three layered structure, in which pure Zn layer, Zn-Mg alloy layer and pure Mg layer are formed in a laminated state as shown in FIG. 23, which is also included within the laminate plating in accordance with the present invention. The present invention includes apparatuses where a Zn layer and a Mg layer are formed by using Zn plating means and Mg plating means. Accordingly, the presence or absence of such mixed Zn-Mg alloy layer or the contents thereof can not escape the scope of the present invention. The steel sheet 3 formed with the vapor deposited layer is delivered out of the sealing rolls 10 and then directly sent to a heating device 29, where it is heated up to a temperature higher than 250° C. Thus, after the layers have been alloyed due to the mutual diffusion in the plating layer, they are cooled in a cooling device 30 and wound to a take up roll 31. In this case, the thickness of plating layer can be adjusted depending on the running speed of the steel sheet 3, the vapor amount of each of metals, etc., and the content ratio of Zn and Mg constituting the plating layer can be adjusted by controlling the ratio for the vapor amount of Zn and Mg from the respective evaporizing vessels 2a and 2b. Further, the time for heating and holding necessary for the mutual diffusion can be adjusted depending on the running speed of the steel sheet 3 or the running length of the steel sheet 3 in the heating device 29.

Figure 22:
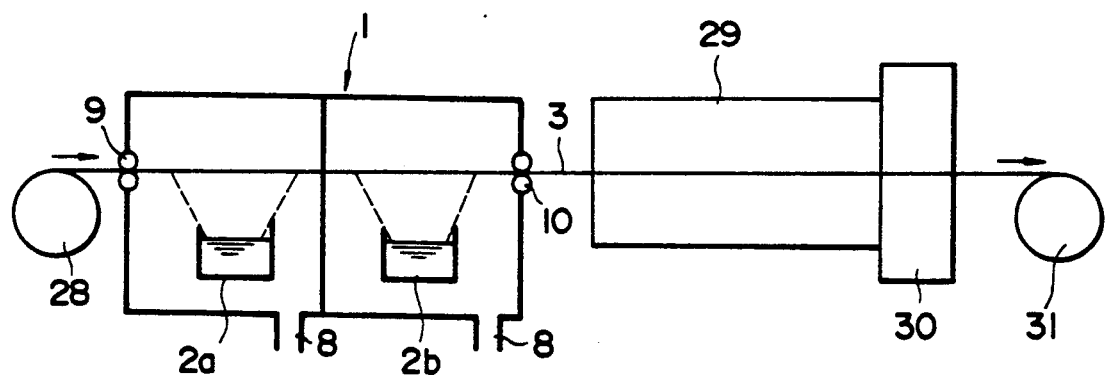

FIG. 22 illustrates another embodiment according to the present invention, in which a vapor deposition chamber 1 is divided into two booths and Zn an Mg are respectively plated by vapor deposition in each booth. In this case, the vapor deposited layer comprises a double-layered structure composed of pure Zn layer and pure Mg layer, which are mutually diffused by applying a predetermined heat treatment to form a uniform Zn-Mg alloy layer.

Of two embodiments described above, particularly, in the method shown in FIG. 21, the Zn-Mg alloy plating layer is formed between pure Zn layer and pure Mg layer because some of Zn vapor and Mg vapor are overlapped under vapor deposition plating and the time required for the mutual diffusion can be shortened by so much to thereby improve the production efficiency.

By the way, although each of the foregoing embodiments shows a case for alloying by passing the heating device 29 after vapor deposition plating, mutual diffusion can also be conducted by utilizing the heat of condensation upon vapor deposition plating. That is, the substrate steel sheet 3 is pre-heated before the vapor deposition also in the prior art and the temperature of the steel sheet is considerably raised by the heat of the pre-heating and the heat of condensation upon vapor deposition. Accordingly, if the vapor deposited steel sheet heated to a certain temperature is introduced as it is into a temperature holding chamber and, if required, a little heating is supplemented for alloying, instead of forcibly cooling or allowing to cool as in the conventional method, allowing cooling due to mutual diffusion can be conducted.

EXAMPLE 1

A cold rolled steel sheet of 0.8 mm thickness was used as the substrate and, after cleaning the surface thereof with electrolytic degreasing, Zn-Mg alloy plating was conducted by way of vacuum vapor deposition. Upon conducting the vacuum vapor deposition, two crucibles were arranged adjacent to each other in a device where the pressure is reduced to less tan $10^{-2}$ Torr and Zn and Mg were charged to the respective crucibles. Then, while heating to vaporize Zn and Mg and delivering the cold rolled steel sheet pre-heated to 200° C. thereabove, Zn-Mg alloy vapor deposition plating was applied on the surface of the steel sheet. In this vapor deposition plating step, the vapor amount of Zn and Mg was adjusted by controlling the heating temperature such that the composition of the vapor deposited layer comprises 0.5-60% of Mg and the substantial balance of Zn.

For each of the plated steel sheets obtained by the above method, the thickness of the intermetallic compound layer formed between the substrate steel sheet and the plating layer was measured and additionally, the adhesion test, the corrosion resistance by the salt spray test (SST) for the uncoated sheet and coated sheet were evaluated.

As the comparison, the same tests were also conducted for the electrogalvanizd steel sheets (electro plating of pure Zn) and the hot dip Zn-Mg alloy plated steel sheets. The results are all shown in Table 3.

Each of the evaluations in the Table 3 was conducted, for the corrosion resistance of the uncoated sheet by the time until red rusts occurred in SST, for the corrosion resistance of the coated sheet, by the blister width of coating films from the scribe after SST, for the thickness of the intermetallic compound layer between the substrate steel sheet and the plating layer by the cross sectional microscopic observation and the adhesion of the plating layer of the OT180° bending test respectively. The adhesion of the plating layer was excellent (symbol ◯) for each of the cases.

TABLE 3

| Experiment No. | Kind of plating | Mg content (wt %) | Plating weight (g/m$^2$) | Intermetallic compound layer with substrate iron (μm) | Adhesion of plating | Time to red rust occurrence (hr) | Blister width of coating film (mm) | Remarks |
|---|---|---|---|---|---|---|---|---|
| 1 | Vapor deposition Zn—Mg | 0.5 | 20 | None | ◯ | 21 | 2.2 | Example |
| 2 | " | 1.0 | 20 | " | ◯ | 38 | 1.8 | " |
| 3 | " | 3.5 | 20 | " | ◯ | 220 | 1.7 | " |
| 4 | " | 5.0 | 20 | " | ◯ | 300 | 1.6 | " |
| 5 | " | 10.0 | 0.5 | " | ◯ | 8 | 1.8 | Reference example |
| 6 | " | 10.0 | 1 | " | ◯ | .20 | 2.0 | " |
| 7 | " | 10.0 | 5 | " | ◯ | 85 | 2.3 | " |
| 8 | " | 10.0 | 10 | " | ◯ | 180 | 2.1 | " |
| 9 | " | 10.0 | 20 | " | ◯ | 350 | 2.0 | " |
| 10 | " | 20 | 20 | " | ◯ | 420 | 3.0 | " |
| 11 | " | 30 | 20 | " | ◯ | 450 | 2.7 | " |
| 12 | " | 40 | 20 | " | ◯ | 440 | 5.0 | " |
| 13 | " | 50 | 20 | " | ◯ | 250 | 13 | Comparative example |
| 14 | " | 60 | 20 | " | ◯ | 210 | 18 | " |
| 15 | Electroplating Zn | — | 5 | None | ◯ | 6 | 2.2 | Comparative example |
| 16 | " | — | 10 | " | ◯ | 9 | 1.8 | " |
| 17 | " | — | 20 | " | ◯ | 20 | 2.8 | " |
| 18 | Hot dip plating Zn—Mg | 0.2 | 5 | <1 | ◯ | 7 | 1.7 | Comparative example |
| 19 | " | 0.2 | 10 | <1 | ◯ | 12 | 2.2 | " |
| 20 | " | 0.2 | 20 | <1 | ◯ | 23 | 2.3 | " |

As apparent from Table 3, the electrogalvanized (pure Zn plated) steel sheets lack in the effect of preventing red rust even if the plating weight is considerably increased. This is the same for the case of the hot dip Zn-Mg alloy plated steel sheets. On the other hand, in the case of the Zn-Mg alloy vapor deposited steel sheets according to the present invention, no intermetallic compound layer was recognized at all between the substrate steel sheet and the plating layer, both of which are firmly adhered to each other and also excellent in he corrosion resistance to the occurrence of red rust. However, if the Mg content in the Zn-Mg alloy vapor deposited layer exceeds 40% (Experiment Nos. 13, 14), corrosion resistance after the coating is degraded and the blister width of the coated film is remarkably increased. Further, if the weigh of the plating layer is less than 1 g/m$^2$ (Experiment No. 5), since the thickness of the plating layer is too thin, corrosion protection can not be obtained effectively. Accordingly, the plating weight is desirably more than 1 g/m$^2$. Further, fit he Mg content in the Zn-Mg alloy vapor deposited layer is 0.5% (Experiment No. 1), although more excellent corrosion protection can be obtained as compared with the conventional materials (Experiment No. 15-17), it is preferred to set the Mg content to greater than 1% in order to take the most advantage of the features according to the present invention.

EXAMPLE 2

Using Al sheet (A-1050) and Al alloy sheet (A-5052) of 0.8 mm thickness as the metal substrate and after cleaning the surface with electrolytic degreasing, vapor deposition plating of Zn-Mg alloy was carried out in accordance with the procedures as those in Example 1.

Usual phosphate treatment was applied to the prepared Zn-Mg alloy vapor deposited Al (or Al alloy) sheet, and the coating weight of phosphate films and concentration of Al$^{3+}$ dissolved into the phosphate treatment solution were examined.

The results are shown in Table 4. For the comparison, the results of experiment using Al or Al alloy sheet without Zn-Mg alloy plating are also shown together Table 4.

In Table 4, Al$^{3+}$ concentration represents the concentration of Al$^{3+}$ dissolved by the treatment to 1 m$^2$/l of specimen sheet. The overall evaluation was as follows:

a: excellent
X: failed

TABLE 4

| Example No. | Kind of plating | Mg (wt %) | Weight of plating (g/m$^2$) | Coating weight of phosphate film (g/m$^2$) | Al$^{3+}$ concentration (ppm) | Overall evaluation | Remarks |
| --- | --- | --- | --- | --- | --- | --- | --- |
| 21 | Vapor deposition Zn—Mg | 10 | 0.5 | 1.5 | 5 | X | Reference example |
| 22 | Vapor deposition Zn—Mg | 10 | 1.0 | 2.2 | <1 | O | Example |
| 23 | Vapor deposition Zn—Mg | 10 | 5.0 | 2.5 | <1 | O | " |
| 24 | Vapor deposition Zn—Mg | 10 | 10 | 2.8 | <1 | O | " |
| 25 | Vapor deposition Zn—Mg | 10 | 20 | 2.6 | <1 | O | " |
| 26 | Vapor deposition Zn—Mg | 10 | 30 | 2.7 | <1 | O | " |
| 27 | without plating A1050 | — | — | <0.1 | 28 | X | Conventional example |
| 28 | without plating A5052 | — | — | <0.1 | 38 | X | Conventional example |

O: excellent
X: not fair

As apparent from the Table 4, phosphate films are scarcely formed and a great amount of Al$^{3+}$ was dissolved in the processing solution in the case of Al and Al alloy sheets without Zn-Mg alloy plating (Experiment Nos. 27, 28), whereas those applied with vapor deposition Zn-Mg alloy plating, sufficient thickness of phosphate films could be formed and dissolution of Al$^{3+}$ was scarcely recognized. However, if the weight of vapor deposited Zn-Mg alloy layer was as low as 0.5 g/m$^2$, the surface protection for the substrate was insufficient and both of the phosphate treatmentability and Al$^{3+}$ dissolution protection were somewhat insufficient. Accordingly, it is desirable that the deposited weight of Zn-Mg alloy is at least greater than 1 g/m$^2$.

EXAMPLE 3

Using cold rolled steel sheets (size: 0.6×70×150 (mm)) as the substrate and after applying Zn-Mg alloy vapor deposition plating of various compositions at a thickness of 5 μm, coating was applied by 90 μm to prepare each of the Specimens Nos. 29 and 35. Then, X-ray diffraction technique was conducted for the plating layer in each of the specimens (Cu-Kα, 45KV, 160 mA) to investigate the absence or the presence of the Mg phase, as well as peeling width of coating films after the salt spray test (SST) 500 hours was measured.

These results are shown in Table 5 together with the composition of Zn-Mg alloy plating layer.

TABLE 5

| Specimen No. | Plating composition | Presence of Mg phase | Peeling width of coating film* (mm) | Evaluation** | Remarks |
|---|---|---|---|---|---|
| 29 | Zn-5.3% Mg | N | 4.0 | O | Example |
| 30 | Zn-11.6% Mg | N | 2.8 | O | " |
| 31 | Zn-15.7% Mg | N | 3.4 | O | " |
| 32 | Zn-20.1% Mg | N | 3.2 | O | " |
| 33 | Zn-21.5% Mg | Y | 10.6 | X | Comparative example |
| 34 | Zn-35.2% Mg | Y | 16.0 | X | Comparative example |
| 35 | Zn-68.4% Mg | Y | 16.6 | X | Comparative example |

*Peeling width of coating film from the end face of the specimen after SST 500h
**O good X not fair
Y: present
N: not present As apparent from the result shown in Table 5, peeling of coating film is remarkable if the Mg phase is present in the plating layer, whereas peeling resistance of coating film is excellent if no Mg phase is present in the plating layer (in the case of Zn phase or Zn-Mg alloy phase). As has been described above, the presence of the Mg phase in the plating layer is not dependent only on the Mg content but also influences by plating conditions, etc. Accordingly, in order to obtain Zn-Mg alloy plating products excellent in the peeling resistance of coating film according to the present invention, it is necessary to properly determine the plating conditions, etc. for the Mg content of Zn-Mg alloy plating layer, not being limited only to the Mg content shown in Table 5.

EXAMPLE 4

Zn-Mg alloy vapor deposited layer of various compositions were prepared on cold rolled steel sheets applied with pre-treatment (plating weight: 20 g/m² in each of the cases). The phase structure of the plating layer was examined by the X-ray diffraction technique and formability and corrosion resistance were also investigated. The formability was evaluated by the exfoliation weight after the Draw bead test, while corrosion resistance was evaluated by the time to red rust occurrence in the salt spray test for the specimen before and after the Draw bead test. As comparative example, pure Zn electroplated steel sheet (electrolytic galvanized steel sheet) and Zn-Ni alloy electroplated steel sheet were used for the same investigation.

These results are collectively shown in Table 6.

TABLE 6

| Specimen No. | Plating composition | Phase structure of the plating layer — Main | Phase structure of the plating layer — Sub (a little) | Formability | Corrosion resistance (time to red rust occurrence) — As plated | Corrosion resistance (time to red rust occurrence) — After forming | Remarks |
|---|---|---|---|---|---|---|---|
| 36 | Zn-3% Mg | Zn, MgZn$_2$ | Mg$_2$Zn$_{11}$ | O | 220 | 200 | Example |
| 37 | Zn-5% Mg | Zn, MgZn$_2$ | Mg$_2$Zn$_{11}$ | O | 300 | 280 | " |
| 38 | Zn-10% Mg | MgZn$_2$, Zn | Mg$_2$Zn$_{11}$ | O | 350 | 350 | " |
| 39 | Zn-20% Mg | MgZn$_2$, MgZn | Mg$_2$Zn$_{11}$ | O | 420 | 410 | " |
| 40 | Zn-30% Mg | MgZn, MgZn$_2$ |  | Δ | 450 | 430 | " |
| 41 | Zn-2% Mg | Zn | Mg$_2$Zn$_{11}$ | Δ | 180 | 100 | Comparative example |
| 42 | Zn-30% Mg | MgZn, Mg | MgZn$_2$ | Δ | 400 | 320 | Comparative example |
| 43 | Electroplating Zn | Zn |  | X | 20 | 16 | Comparative example |
| 44 | Electroplating Zn alloy | Ni$_5$Zn$_{21}$ |  | Δ | 350 | 280 | Comparative example |

O Excellent
Δ Good
X Not fair

As apparent from the result shown in Table 6, the Zn-Mg alloy vapor deposited steel sheets according to that present invention are excellent in the formability and degradation of corrosion resistance after forming was scarcely perceptible. On the other hand, the Zn-electric plated steel sheet (No. 43) was poor not only in the corrosion resistance before forming (as plated) but also remarkably in the formability as compared with the Zn-Mg alloy vapor deposited steel sheet according to the present invention. Further, Zn-Ni electroplated steel sheet (No. 44) is excellent in the corrosion resistance before forming (as plated), but the formability is inferior to that of the Zn-Mg alloy vapor deposited steel sheet according to the present invention and, remarkable degradation of corrosion resistance after forming was shown. In the specimen No. 41, since a plating layer contains only a small amount of intermetallic compound Mg$_2$Zn$_{11}$ and mainly composed of Zn, the corrosion resistance were especially poor. Further, although Specimen No. 42 had the same Mg content as that of Specimen No. 40, a Mg phase was formed due to the difference in the vapor deposition conditions as described above and not only degradation in the formability but also degradation in the corrosion resistance after forming were recognized.

EXAMPLE 5

A cold rolled steel sheet of 0.8 mm thickness was used as the substrate ad, after cleaning the surface thereof with electrolytic degreasing, Zn-Mg alloy platings of various compositions were conducted by way of vacuum vapor deposition method. Upon conducting the vacuum vapor deposition, two crucibles were arranged in adjacent to each other in a deposition chamber, where the pressure is reduced to less than 10$^{-2}$ Torr, and Zn and Mg were charged to the respective crucibles. Then, while heating to vaporize Zn and Mg and the cold rolled steel sheet was pre-heated to 200° C. running above the crucibles, Zn-Mg alloy layer was vapor-deposited on the surface of the steel sheet. Salt spray test (SST) was conducted to the obtained Zn-Mg alloy vapor deposited steel sheet to examine the time to the occurrence of the red rust. The results are shown in FIG. 24.

Figure 24:
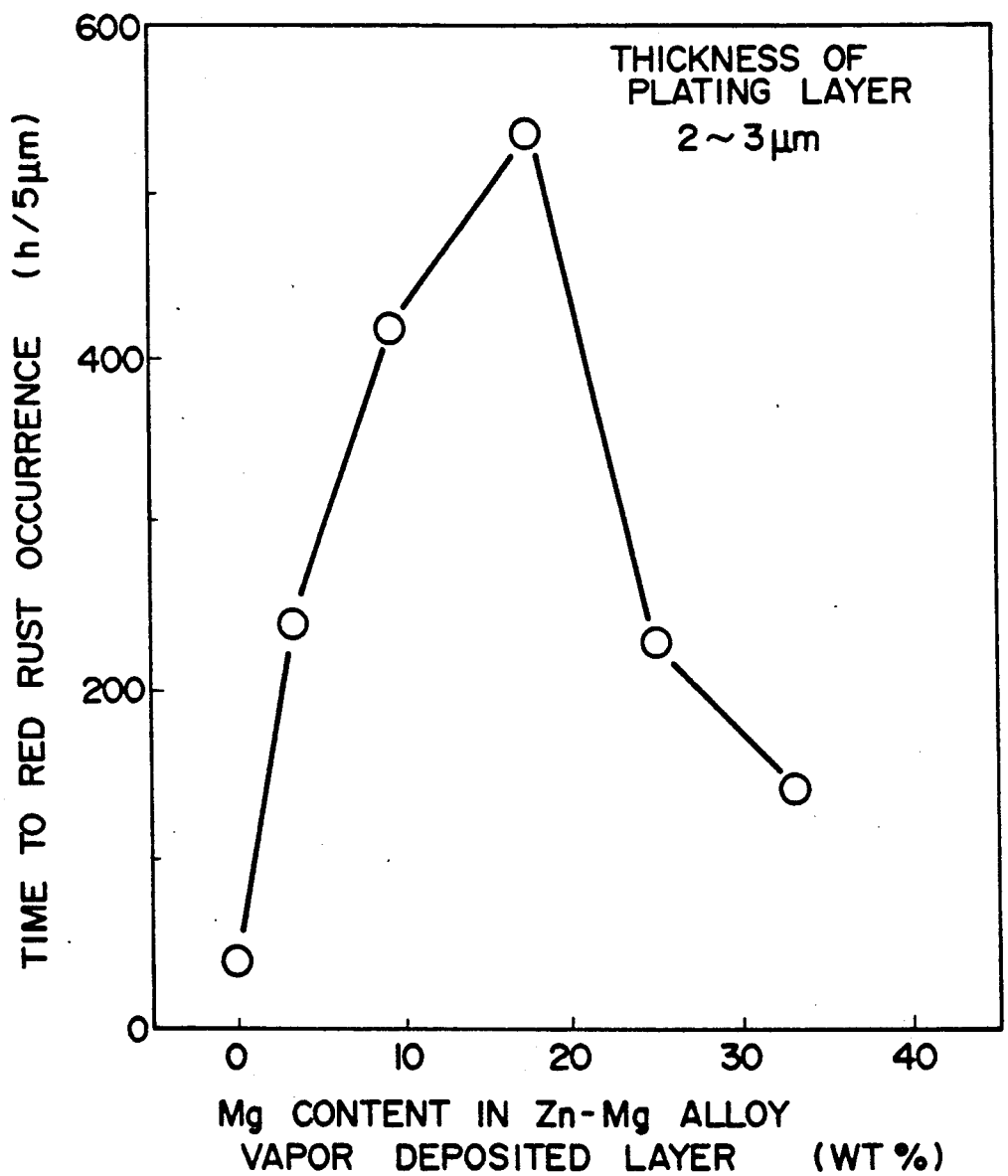
FIG. 24 shows a relationship between the content of Mg in the Zn-Mg alloy vapor deposited layer and the time to red rust occurrence.

As apparent from FIG. 24, those of 3 to 30% and, particularly, 5 to 25% of Mg content were excellent in the corrosion resistance.

EXAMPLE 6

Using by the same method as shown in Example 5, Zn-10%Mg alloy vapor deposited steel sheets were prepared Tests (1)–(6) described later were conducted on the obtained Zn-10%Mg alloy vapor deposited steel sheets. For the comparison, the same test was also conducted on the pure Zn electroplated (electrolytic galvanized) steel sheets and Zn-12%Ni alloy vapor deposited steel sheets obtained in the same manner as in Example 5. The Zn-12%Ni alloy vapor deposited steel sheet is one of the Zn alloy vapor deposited materials excellent in the corrosion resistance obtained as the result of the study made by the present inventors.

(1) Time to the occurrence of red rust

The time to the occurrence of red rust was measured by salt spray test (SST) for evaluating the corrosion resistance of various kind of plated steel sheets.

TABLE 7

| | Plating composition | Thickness of plating layer (plating weight) | Time to read rust occurrence |
|---|---|---|---|
| Example | Zn-10% Mg alloy | 4.3 μm (24 g/m$^2$) | 1200 hrs |
| Comparative example | Zn-12% Ni alloy (vapor deposition) | 4.2 μm (30 g/m$^2$) | 710 hrs |
| Comparative example | Zn alloy (electroplating) | 5.6 μm (40 g/m$^2$) | 50 hrs. |

As apparent from Table 7, it can be seen that Zn-10%Mg alloy vapor deposited steel sheet shows much longer time to the occurrence of red rust and excellence in corrosion resistance as compared with others. This also demonstrated by the results of the tests (2), (3), (4), (5) and (6) described later.

(2) Corrosion current after salt spray test

Figure 25:
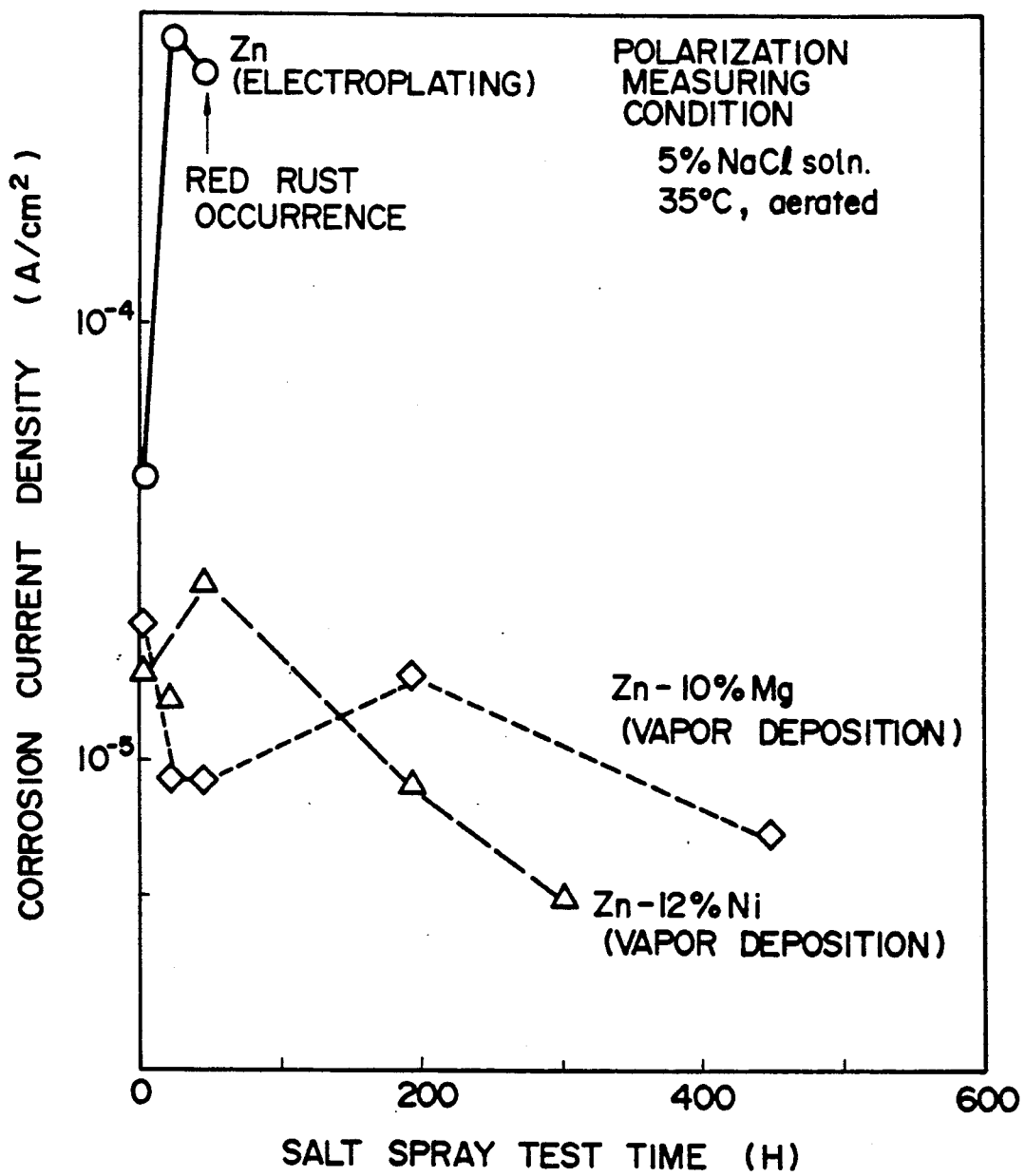
FIG. 25 shows a relationship between the salt spray test time and the corrosion current in a solution of salt for various kinds of zinc-plated steel sheets.

Salt spray test was conducted to plated steel sheets shown in Table 7. The relationship between the corrosion current and the salt spray test time is shown in FIG. 25. Polarization curve was measured at 35° C. in aerated 5% NaCl solution to determine corrosion current.

As apparent from FIG. 25, in the case of pure Zn electroplated steel sheet, the corrosion current density was great and so the red rust occurred at about 50 hours in the salt spray test. On the other hand, in the Zn-10%Mg alloy vapor deposited steel sheets according to the present invention, the corrosion current was very small as compared with pure Zn electroplated steel sheet. This means that the Zn-Mg alloy plating layer has the excellent corrosion resistance.

(3) X-ray diffraction patterns of the rust layer after salt spray test.

Figure 26:
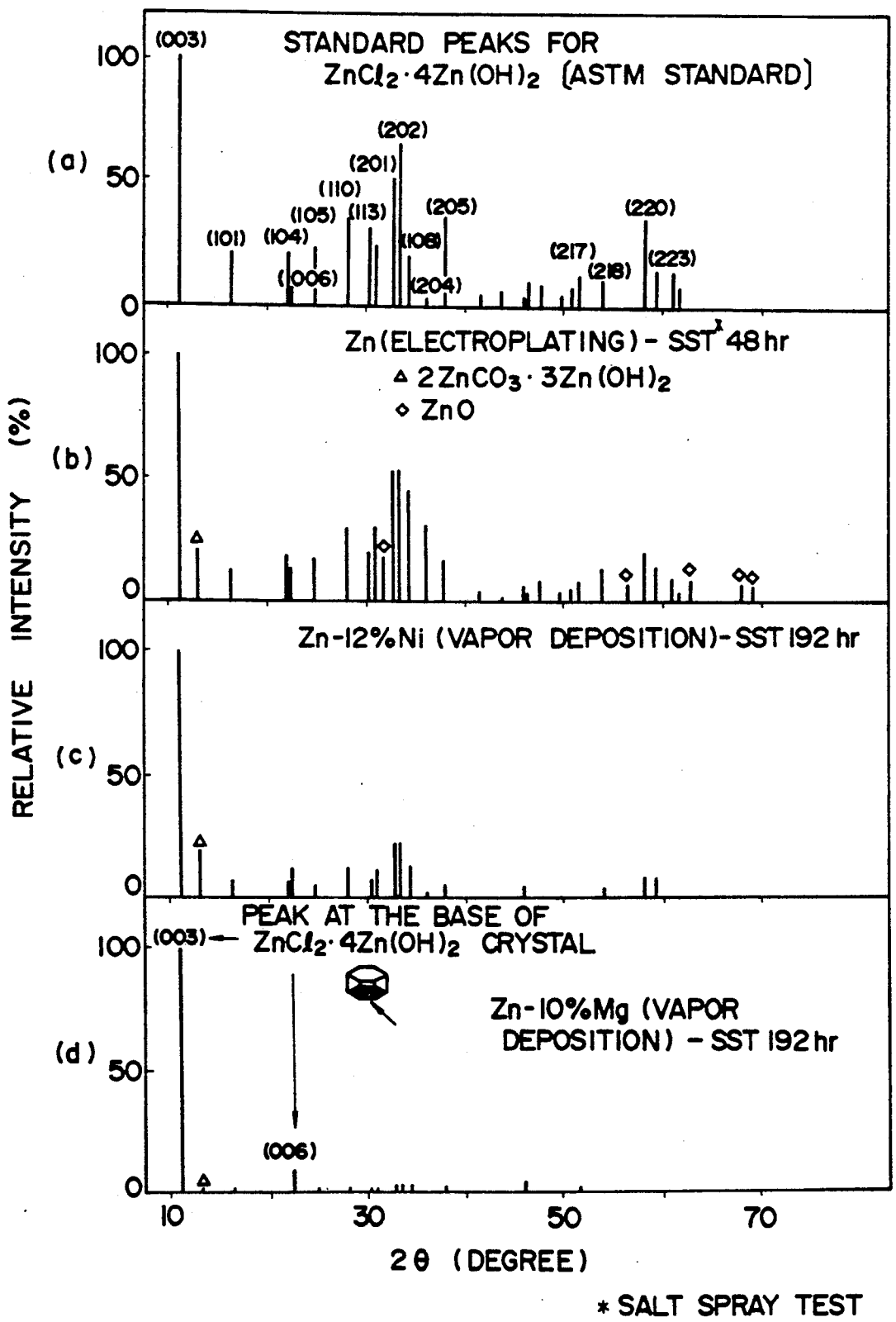
FIG. 26 shows X-ray diffraction patterns for corrosion products.

Salt spray test was conducted on plated steel sheets shown in Table 7 and the results of X-ray diffraction patterns of formed rust layers are shown in FIGS. 26 (b), (c), (d). FIG. 26(a) shows X-ray diffraction pattern for ZnCl$_2$.4Zn(OH)$_2$ (ASTM standard) standard products.

FIG. 26(b) shows the X-ray diffraction patterns of the rust layer after salt spray test (simply referred to as SST) 48 hours to pure Zn electroplating, in which peaks appear for ZnCO$_3$.3Zn(OH)$_2$ or ZnO but not for ZnCl$_2$.4Zn(OH)$_2$. FIG. 26(c) shows that after SST 192 hours for Zn-12%Ni alloy vapor deposition plating, in which peaks appear for ZnCO$_3$.3Zn(OH)$_2$ but not for ZnCl$_2$.4Zn(OH)$_2$.

FIG. 26(d) shows the X-ray diffraction patterns of rust layer after SST 192 hours to Zn-10%Mg alloy vapor deposition plating. Peak for the base of hexagonal system crystals of ZnCl$_2$.4Zn(OH)$_2$ ((003), (006)) appeared preferentially. That is, the rust obtained from Zn-Mg alloy vapor deposition plating consist of only ZnCl$_2$.4Zn(OH)$_2$ and has the preferred orientation in comparison with the ASTM standard patterns of ZnCl$_2$.4Zn(OH)$_2$ shown in FIG. 26(a).

(4) Composition of plating layers after salt spray test

Figure 27:
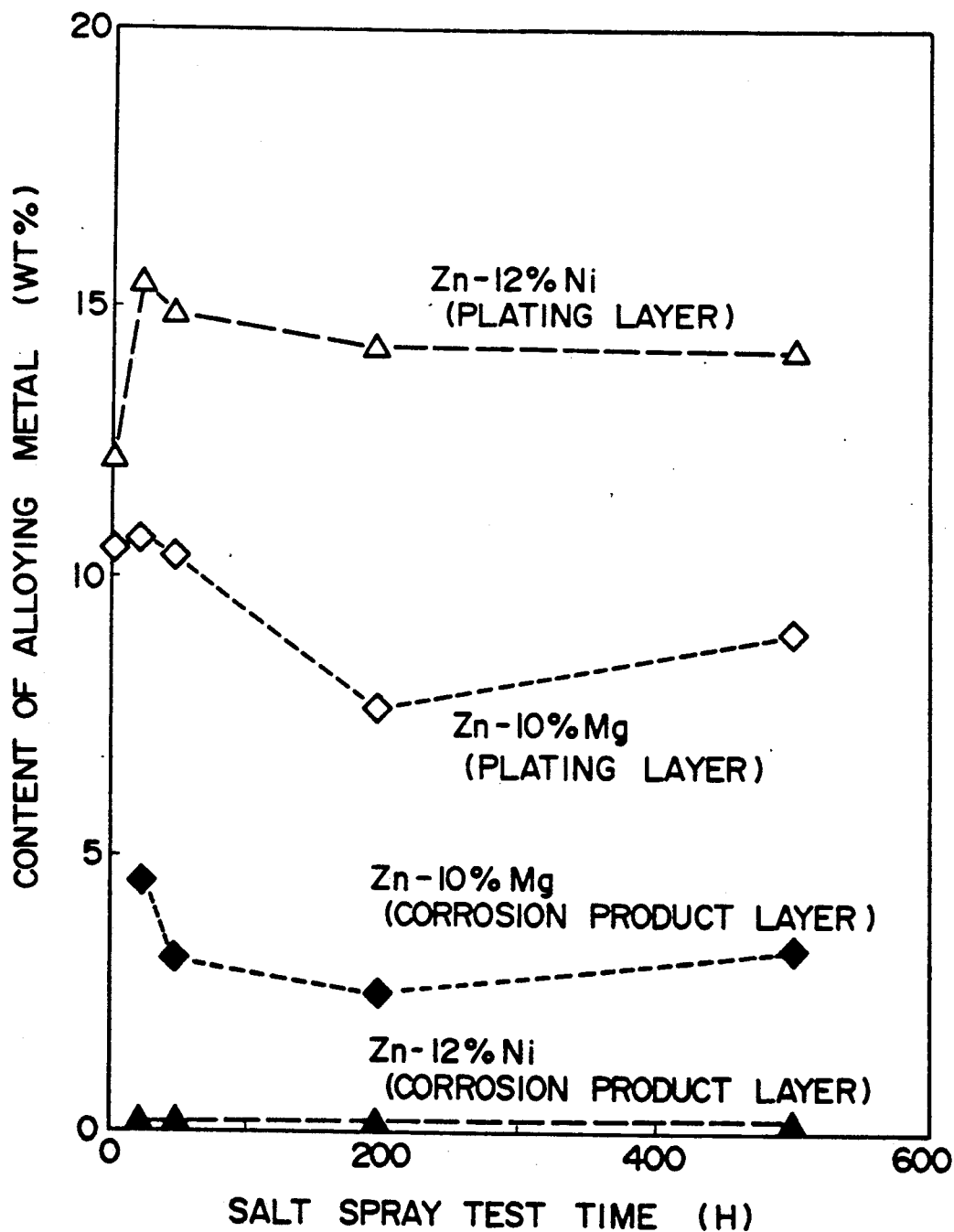
FIG. 27 shows a relationship between the salt spray test time and the content of alloying metals in the plating layer and the corrosion product layer after salt spray test for various kinds of plated steel sheets.

Salt spray test was conducted on plated steel sheets shown in Table 7 and the content of the alloying metals in the plating layer and the content of the alloying metals in the corrosion product (rust) were examined and the results are shown in FIG. 27.

As apparent from FIG. 27, it can be seen that in the Zn-12%Ni alloy plating layer, the Ni content in the corrosion product is low and that in the plating layer is increased. This means that Ni in the Zn-Ni alloy layer is concentrated along with the corrosion. As the Ni in the Zn-Ni alloy layer is concentrated, the corrosion potential becomes noble (refer to FIG. 28) to eliminate the sacrificial corrosion protection. On the other hand, Mg in the Zn-Mg alloy plating layer shows no substantial change and so corrosion potential remains less noble to maintain sacrificial corrosion protection (refer to FIG. 28).

(5) Corrosion potential after salt spray test

Figure 28:
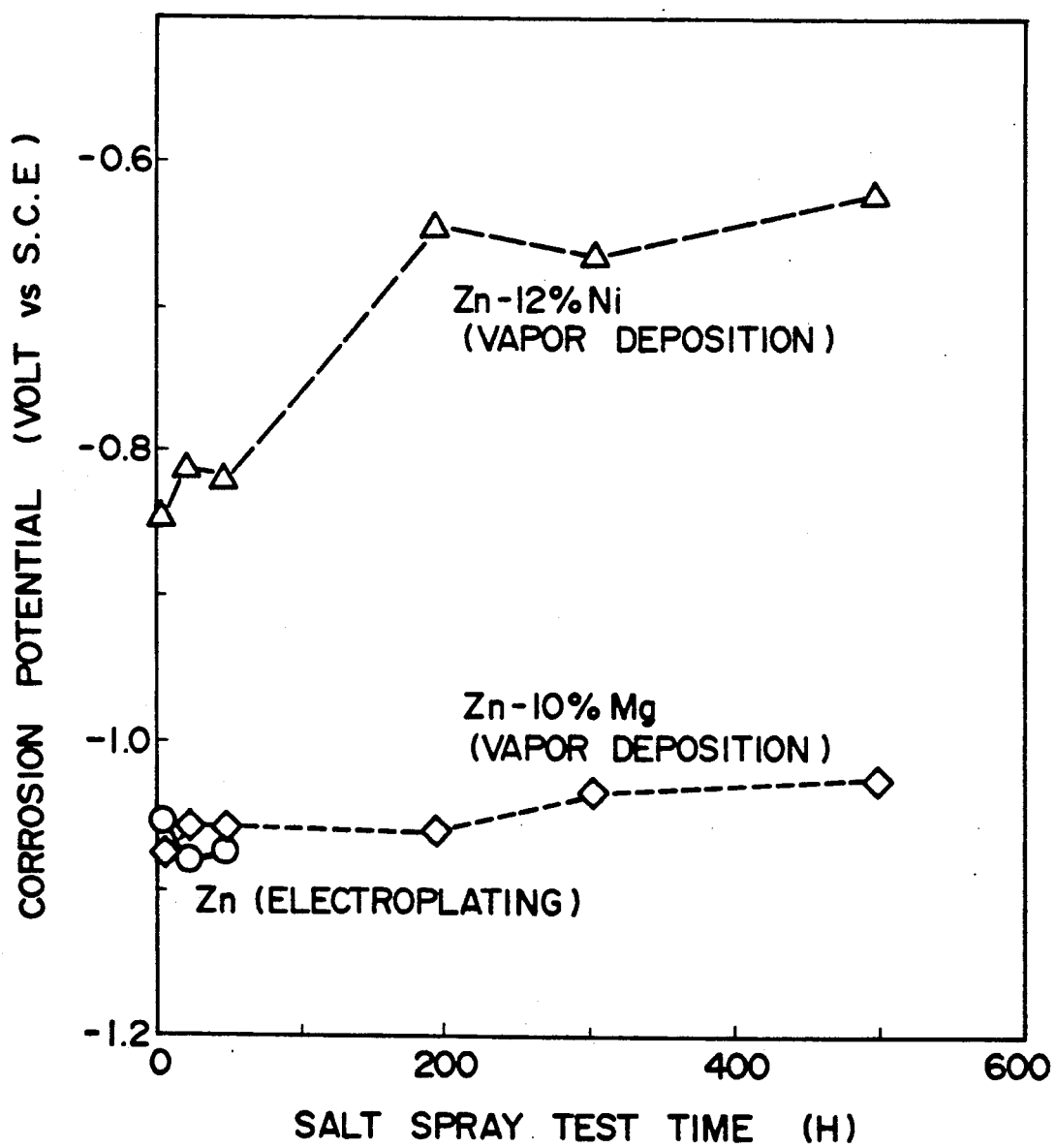
FIG. 28 illustrates a relationship between the salt spray test time and the corrosion potential of platings.

Salt spray test was conducted on various plated steel sheets to measure the corrosion potential. The results are shown in FIG. 28. As apparent from FIG. 28 (also estimated from the change in the composition of the plating layer after salt spray test shown in FIG. 27), the corrosion potential becomes noble gradually in the Zn-12%Ni alloy vapor deposition plating. On the other hand, in the Zn-10%Mg alloy vapor deposition plating and pure Zn electroplating, this phenomenon is not recognized and the corrosion potential remains less noble. This also shows that the sacrificial corrosion protection for the substrate steel sheet is reduced in Zn-12%Ni alloy plating and that the Zn-10%Mg vapor deposition plating according to the present invention maintains the sacrificial corrosion protection for a long time and is more excellent in the corrosion resistance.

(6) Weight loss by corrosion after salt spray test

Figure 29:
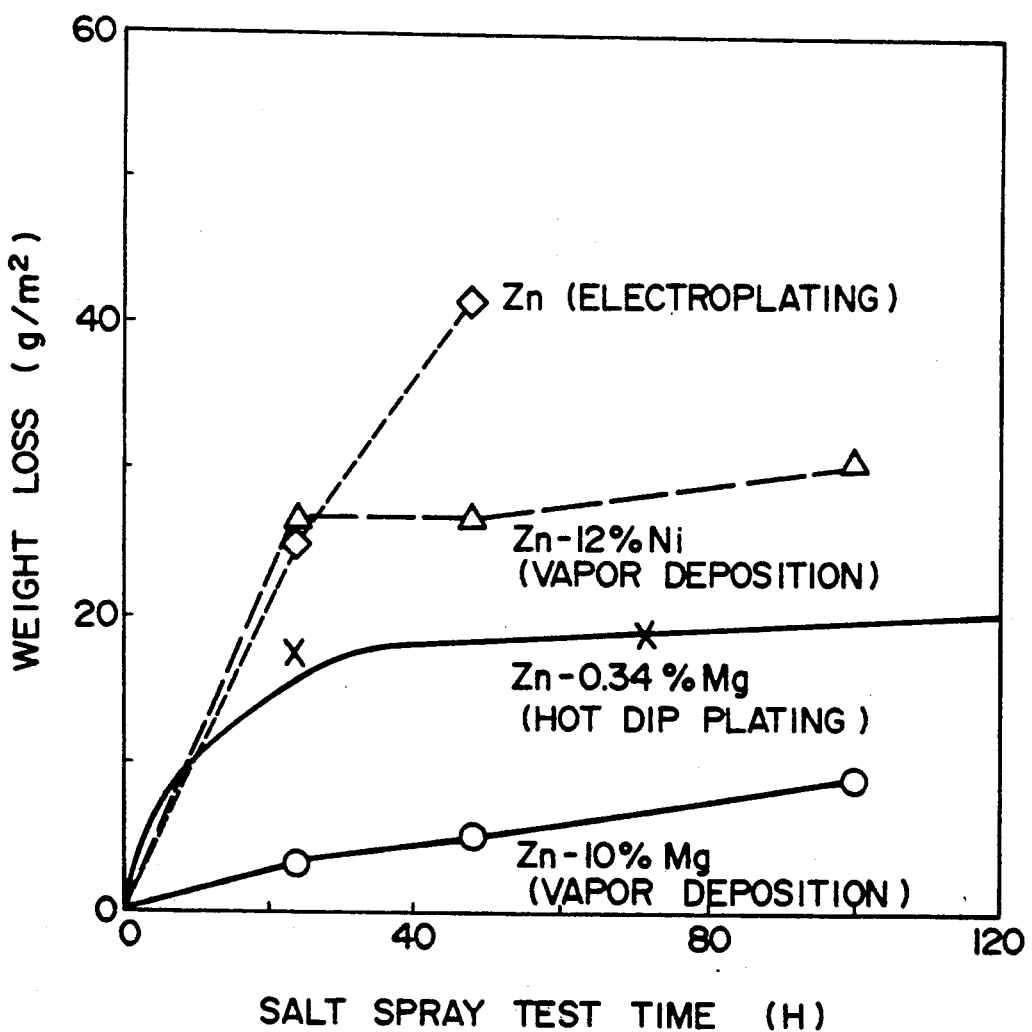
FIG. 29 illustrates a relationship between the salt spray test time and the weight loss in the plating layers.

Salt spray test was conducted on various plated steel sheets and weight loss of platings was examined. The results are shown in FIG. 29. Further, the results are also shown together for those applied with hot dip Zn-0.35%Mg alloy plating.

As apparent from FIG. 29, it can be seen that the Zn-10%Mg alloy vapor deposited steel sheet according to the present invention shows less weight loss by corrosion, and is excellent in the corrosion resistance as compared with other plated steel sheets. As a result of conducting the salt spray test for a longer time, the weight loss was increased abruptly in hot dip Zn-0.34%Mg alloy plating although not shown in FIG. 29.

EXAMPLE 7

Various kind of zinc alloy plated steel sheets shown in the following Table 8 were prepared by vacuum vapor deposition (Specimens Nos. 45-62) and the corrosion resistance was evaluated. The corrosion resistance of the obtained plated steel sheets was evaluated by the time to the occurrence of red rust for salt spray test (SST) at 30° C. The plating conditions are as described below.

Plating Condition:

Vapor deposition method for Zn, Mg and other alloying metals:

Respective metals are heated to vaporate in respective crucibles. Electron beams (EB) were used as heating source and the power of EB was adjusted such that each of the compositions as shown in Table 8 was obtained.

Pressure in deposition chamber: $10^{-3}$ Torr.
Pre-heating temperature to substrate: 200° C.

The results of corrosion resistance are shown together with the plating compositions in Table 8.

EXAMPLE 8

After cleaning a cold rolled steel sheet of 0.6 mm thickness with electrolytic degreasing, Zn-Mg alloy vapor deposition plating of various compositions was applied under pressure of $1 \times 10^{-2}$ Torr, for which each of the evaluation tests described later was conducted. The results are shown in Table 9.

As apparent from Table 9, although the corrosion resistance of the uncoated Zn-Mg alloy vapor deposited layer is improved with increase in Mg content, the corrosion resistance after coating is reduced along with the increase in Mg content in the Zn-Mg alloy vapor deposited layer.

Furthermore, composite layer Zn-series plated (double-layered) steel sheets were prepared by applying Zn-vapor deposition plating or Zn-alloy vapor deposition plating containing one or more of Ni, Co, Mn, Fe, Cr, Mo and Cu on a Zn-Mg alloy vapor deposited layer, for which each of the evaluation tests described later was conducted. The results are shown in Table 9.

As apparent from Table 10, Specimen Nos. 2-17 which are the composite layer Zn-series (double-layered) vapor deposition plated steel sheets according to the present invention have excellent corrosion resistance without coating and after coating.

TABLE 8

| Specimen No. | Mg content (%) | Content of other metals (substantial balance of Zn and Mg) | Tickness of plating layer (μm) | Time to Red rust occurrence (hr) | Remarks |
|---|---|---|---|---|---|
| 45 | 0 | — | 6.2 | 50 | Comparative example |
| 46 | 0.2 | — | 3.1 | 37 | Comparative example |
| 47 | 5.3 | — | 2.1 | 176 | Comparative example |
| 48 | 5.6 | 4.6% Cr | 2.3 | 276 | Example |
| 49 | 11.5 | — | 2.3 | 198 | Comparative example |
| 50 | 11.0 | 0.2% Ti | 2.4 | 206 | Comparative example |
| 51 | 11.0 | 0.2% Ni | 2.2 | 190 | Comparative example |
| 52 | 10.5 | 2.0% Cr | 2.1 | 244 | Example |
| 53 | 12.1 | 2.0% Al + 1.1% Cr | 2.2 | 251 | " |
| 54 | 10.7 | 1.9% Cr + 1.1% Ni | 2.2 | 277 | " |
| 55 | 12.0 | 3.6% Ti | 2.1 | 294 | " |
| 56 | 11.5 | 4.4% Al | 2.5 | 275 | " |
| 57 | 13.1 | 4% Ni | 2.3 | 276 | " |
| 58 | 24.2 | 1.4% Ti + 2.2% Cr | 2.5 | 340 | " |
| 59 | 9.4 | 6.2% Co + 2.4% Ti | 2.0 | 212 | Comparative example |
| 60 | 40.3 | — | 2.8 | 84 | Comparative example |
| 61 | 43.2 | 7.2% Ni + 2.1% Co | 2.8 | 80 | Comparative example |
| 62 | 58.9 | 3.0% Cr | 2.2 | 57 | Comparative example |

From the results shown in Table 8, it can be considered as below.

(1) As apparent from Specimens Nos. 50, 51, if the content of alloying metal added is less than 0.5%, the effect for improving corrosion resistance is insufficient.

(2) As apparent from Specimen No. 59, if the content of the alloying metals added exceeds 5%, the sacrificial corrosion protection is deteriorated.

(3) As apparent from Specimens Nos. 60-62, if the Mg content exceeds 30 %, the effect for improving the corrosion resistance is reduced.

Evaluation Test (1) Corrosion resistance without coating (as plated) (evaluated by the time to the occurrence of red rust)

Corrosion resistance was evaluated using by the following cyclic corrosion test.

1 cycle  Dipping (5% NaCl, 50° C., 5 hr) ↓

24 hr Drying (50° C., 3 hr)

↓

Wetting (humidity 98%, 50° C., 16 hr)

(2) Corrosion resistance after electrodeposition (ED) coating

After phosphate treatment, cation-type electrodeposition coating (20 μm) was applied, and the coating film was applied with cross cuts and corrosion resistance was evaluated by the blister of the coating film from scribe (the cross cut portions) after the salt spray test 800 hours.

(3) Corrosion resistance after 3-layer coating

TABLE 9-continued

| First layer: Zn—Mg alloy plating | | Corrosion resistance without coating | Corrosion resistance after coating | |
|---|---|---|---|---|
| Mg (%) | Thickness (μm) | | after only electrode-position coating | after 3-layer coating |
| 30 | 5 | ⊚ | X | X |
| 40 | 5 | ⊚ | X | X |
| 50 | 5 | | X | X |
| Electric Zn plating | 5.6 | X | Δ | Δ |

⊚: excellent
: good
Δ: fair
X: not fair

TABLE 10

| | Zn—Mg alloy plating layer | | Zn alloy plating layer on Zn—Mg alloy layer | | | | | | | | Corrosion resistance without coating | Corrosion resistance after coating | |
|---|---|---|---|---|---|---|---|---|---|---|---|---|---|
| No. | Mg Content (%) | Thickness (μm) | Ni | Co | Mn | Fe | Cr | Mo | Cu | Zn | Thickness (μm) | | Only electro-deposition coating | 3-layer coating |
| 63 | 0.2 | 5 | — | — | 1 | 1 | 2 | — | — | Balance | 0.5 | | | |
| 64 | 0.5 | 5 | — | 2 | 1 | 5 | — | — | — | " | 0.5 | | | |
| 65 | 1.0 | 5 | 7 | — | — | — | — | — | — | " | 1.0 | ⊚ | ⊚ | ⊚ |
| 66 | 5.0 | 5 | — | — | — | — | — | — | — | 100 | 1.0 | ⊚ | ⊚ | ⊚ |
| 67 | 5.0 | 5 | 12 | — | — | 5 | — | — | — | Balance | 1.0 | ⊚ | ⊚ | ⊚ |
| 68 | 5.0 | 5 | — | — | — | 10 | — | — | — | " | 0.7 | ⊚ | ⊚ | ⊚ |
| 69 | 5.0 | 5 | — | 3 | 2 | 3 | 1 | 1 | — | " | 1.0 | ⊚ | ⊚ | ⊚ |
| 70 | 5.0 | 5 | 1 | 0.2 | 2 | 2 | 2 | 2 | — | " | 0.5 | ⊚ | ⊚ | ⊚ |
| 71 | 10 | 5 | — | — | — | 15 | — | — | — | " | 0.1 | ⊚ | ⊚ | ⊚ |
| 72 | 10 | 5 | 5 | 3 | — | 10 | — | — | — | " | 1.0 | ⊚ | ⊚ | ⊚ |
| 73 | 10 | 5 | — | — | 3 | — | — | 5 | — | " | 0.5 | ⊚ | ⊚ | ⊚ |
| 74 | 10 | 5 | — | — | — | 10 | — | — | — | " | 0.3 | ⊚ | ⊚ | ⊚ |
| 75 | 10 | 5 | — | — | — | 10 | — | — | — | " | 2.0 | ⊚ | ⊚ | ⊚ |
| 76 | 10 | 5 | — | — | — | — | 2 | — | 2 | " | 1.0 | ⊚ | ⊚ | ⊚ |
| 77 | 20 | 5 | 3 | — | — | — | — | 7 | — | " | 1.0 | ⊚ | ⊚ | ⊚ |
| 78 | 30 | 5 | — | 7 | — | — | 2 | — | — | " | 1.0 | ⊚ | | |
| 79 | 40 | 5 | — | — | 10 | — | — | 3 | — | " | 0.5 | ⊚ | | |
| 80 | 10 | 5 | 12 | — | 5 | 10 | — | — | — | " | 0.5 | | | Δ |
| 81 | 10 | 5 | — | 6 | 6 | 10 | — | — | — | " | 1.0 | | Δ | |
| 82 | 50 | 5 | 3 | — | — | 10 | 1 | 1 | 2 | " | 1.0 | | X | |
| 83 | 50 | 5 | 1 | 2 | 1 | 1 | 2 | — | — | " | 1.0 | | Δ | Δ |

⊚: Excellent
: Good
Δ: Fair
X: Not fair

After phosphate treatment, cation-type electrodeposition coating (20 μm), medium coating (35 μm) and top coating (35 μm) were applied and the coating films were applied with cross cuts. After 30 cycles of the cyclic corrosion test shown in (1), a pressure sensitive adhesive tape was appended over the scribe cross cut portion) and then peeled to evaluate the corrosion resistance by the peeling width of the coating films.

TABLE 9

| First layer: Zn—Mg alloy plating | | Corrosion resistance without coating | Corrosion resistance after coating | |
|---|---|---|---|---|
| Mg (%) | Thickness (μm) | | after only electrode-position coating | after 3-layer coating |
| 0.2 | 5 | Δ | | |
| 0.5 | 5 | | | |
| 1,0 | 5 | ⊚ | | |
| 5 | 5 | ⊚ | Δ | Δ |
| 10 | 5 | ⊚ | Δ | Δ |
| 20 | 5 | ⊚ | X | X |

EXAMPLE 9

Two crucibles were arranged in a vacuum deposition chamber and Zn and Mg metals were prepared in respective crucibles and respective metals were melted and vaporized by irradiating two electron beams to them. On the other hand, a cold rolled sheet (0.7 mm thickness), the surface of which had been already activated in vacuum, was horizontally set at a predetermined distance over the crucibles, and Zn and Mg were vaporized under the control of the evaporation amount by adjusting the electron beam power to obtain Zn-Mg alloy plated steel sheets a predetermined film thickness (plating weight) and predetermined Mg content.

After alkali degreasing and rinsing the obtained Zn-Mg alloy plated steel sheets, chromate coating layer was formed on Zn-Mg alloy plating layer. The coating weight was adjusted such that the total Cr content in the chromate layer was 50 mg/m².

After chromate treatment, a mixed solution comprising an aqueous polyurethane resin emulsion, colloidal silica and distilled water was coated by a bar coater, dried and then baked at 200° C.×1 min to form a film layer of SiO₂/urethane resin ratio=0.40 (weight ratio) with the average film thickness of 1.5 μμm.

The obtained anti-rust steel sheets were cut out into 70 mm(w)×150 mm(1) and the cut out end faces and the surface not treated with each of the treatment described above (rear face) was sealed with a tape and cyclic corrosion test described below was practiced for 2000 cycles.

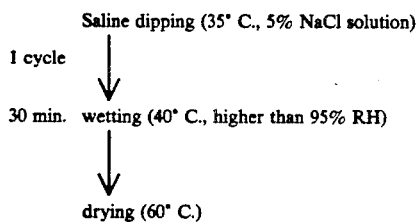

Saline dipping (35° C., 5% NaCl solution)

1 cycle 30 min. wetting (40° C., higher than 95% RH)

drying (60° C.)

After practicing the cyclic corrosion test, red rust was removed with an ammonium citrate solution and the corrosion depth in the substrate steel sheet was measured by using a dial gauge. The results are shown together with comparative examples in FIG. 30. The comparative examples comprise the plating layer compositions or the coating film layer compositions which are different from defined in the present invention.

As apparent from FIG. 30, it can be seen that the anti-rust steel sheets having Zn-Mg alloy plated layer and polyurethane film layer according to the present invention show small maximum corrosion depth and are excellent in the corrosion resistance as compared with others. Furthermore, the coatability and formability were also satisfactory.

EXAMPLE 10

In the same manner as in Example 9, Zn-Mg alloy plating steel sheets were obtained and further chromate coating layer was formed. After chromate treatment, a mixed solution comprising an aqueous polyurethane resin emulsion, colloidal silica, silane coupling agent and distilled water was coated by means of bar coater, dried, baked at 200° C. for 1 min to obtain an anti-rust steel sheet. In the obtained coating resin film, the SiO₂/urethane resin ratio was 0.4 (weight ratio) and the average film thickness was 1.5 μm. The same cyclic corrosion test shown in Example 9 was conducted to the obtained anti-rust steel sheet. The results are shown in FIG. 30 (Specimen No. 10). It can be seen that the corrosion resistance is excellent from the result of maximum corrosion depth. Moreover, electrodeposition coatability and paint adhesion were also satisfactory.

EXAMPLE 11

After cleaning cold roll steel sheets of 0.8 mm thickness with electrolytic degreasing, a predetermined first plating layer of 0.1–3 g/m² was formed under the pressure to $10^{-2}$–$10^{-5}$ Torr in deposition chamber and, subsequently, a Zn-Mg alloy plating layer with 5–15% Mg content was formed under the same conditions to obtain 2-layered plated steel sheets as shown in Table 11. For each of the obtained plated steel sheets, adhesion test for the plating layer (tape peeling after OT 180° bending test—○: with no peeling (good), Δ: partial peeling (fair), X: entire peeling (not fair)) was applied and the results are shown in Table 11.

TABLE 11

| First layer: plating composition (wt %) | | | | | | | | Plating weight (g/m²) | Second layer: vapor deposition Zn—Mg plating | Plating weight (g/m²) | Formability (OT 180° bending) |
|---|---|---|---|---|---|---|---|---|---|---|---|
| Al | Co | Cu | Fe | Mg | Ni | Ti | Zn | | | | |
|  |  |  |  |  |  |  | 100 | 2.0 | Zn-5% Mg | 20 | ○ |
| 100 |  |  |  |  |  |  |  | 1.0 | Zn-10% Mg | " | ○ |
|  |  |  |  |  | 100 |  |  | 0.5 | " | " | ○ |
|  |  | 100 |  |  |  |  |  | 0.5 | " | " | ○ |
|  |  |  |  |  |  | 100 |  | 0.5 | " | " | ○ |
|  | 100 |  |  |  |  |  |  | 3.0 | Zn-15% Mg | " | ○ |
|  |  |  | 100 |  |  |  |  | 2.0 | Zn-10% Mg | " | ○ |
|  |  |  |  | 100 |  |  |  | 2.0 | " | " | ○ |
| 100 |  |  |  |  |  |  |  | 0.1 | " | " | Δ |
|  |  |  |  |  |  |  | 100 | 0.1 | " | " | Δ |
| 3 |  |  |  |  |  |  | Balance | 2.0 | " | " | ○ |
|  |  |  |  | 3 |  |  |  | 2.0 | " | " | ○ |
|  |  |  |  |  | 2 |  |  | 2.0 | " | " | ○ |
|  |  |  |  | 3 |  |  |  | 2.0 | " | " | ○ |
|  |  | 3 |  |  |  |  |  | 2.0 | " | " | ○ |
|  | 1 |  |  |  | 4 |  |  | 2.0 | " | " | ○ |
|  |  |  |  |  |  |  |  |  | Zn-1% Mg | " | ○ |
|  |  |  |  |  |  |  |  |  | Zn-3% Mg | " | ○ |
|  |  |  |  |  |  |  |  |  | Zn-5% Mg | " | Δ |
|  |  |  |  |  |  |  |  |  | Zn-10% Mg | " | Δ |
|  |  |  |  |  |  |  |  |  | Zn-15% Mg | " | X |
|  |  |  |  |  |  |  |  |  | Zn-20% Mg | " | X |

What is claimed is:

1. A Zn-Mg alloy plated metal material of excellent corrosion resistance consisting essentially of a vapor deposited layer comprising 0.5–40% by weight of Mg and the substantial balance of Zn formed on the surface of a metal substrate, wherein the Zn-Mg alloy vapor deposited layer mainly consists of Zn-Mg intermetallic compounds comprising one or more of Mg₂Zn₁₁, MgZn₂ and MgZn, and not substantially containing a phase consisting of only Mg.

2. The Zn-Mg alloy plated metal material as defined in claim 1, wherein said vapor deposited layer contains a phase consisting of only Zn.

3. The Zn-Mg alloy plated metal material as defined in claim 1 or 2, wherein a corrosion product layer is formed on the surface of the Zn-Mg alloy vapor deposited layer, said corrosion product layer comprising Mg and $ZnCl_2.4Zn(PH)_2$, and hexagonal system crystals of the $ZnCl_24Zn(PH)_2$ are oriented in the direction of the Zn-Mg alloy plating thickness.

4. The Zn-Mg alloy plated metal material as defined in claim 1, wherein said vapor deposit layer comprises 5-25 wt. % Mg.

5. The Zn-Mg alloy plated metal material as defined in claim 2, wherein said vapor deposit layer comprises 5-25 wt. % Mg.

* * * * *